United States Patent
Choi et al.

(10) Patent No.: US 10,205,122 B2
(45) Date of Patent: Feb. 12, 2019

(54) ORGANIC LIGHT-EMITTING DISPLAY AND METHOD OF MANUFACTURING THE SAME

(71) Applicant: Samsung Display Co., Ltd, Yongin-si, Gyeonggi-do (KR)

(72) Inventors: Jonghyun Choi, Yongin-si (KR); Kinyeng Kang, Yongin-si (KR); Sunkwang Kim, Yongin-si (KR); Suyeon Sim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/298,040

(22) Filed: Oct. 19, 2016

(65) Prior Publication Data

US 2017/0148856 A1    May 25, 2017

(30) Foreign Application Priority Data

Nov. 20, 2015  (KR) .................. 10-2015-0163351
Dec. 31, 2015  (KR) .................. 10-2015-0191024

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 27/3258* (2013.01); *H01L 51/0096* (2013.01)

(58) Field of Classification Search
None
See application file for complete search history.

(56) References Cited

U.S. PATENT DOCUMENTS

| 4,488,818 A | * | 12/1984 | Saurer | ................. G04G 9/0094 368/242 |
| 5,701,055 A | * | 12/1997 | Nagayama | .......... H01L 27/3246 313/504 |
| 5,740,130 A | * | 4/1998 | Grupp | ............... G02F 1/133553 349/113 |
| 6,348,359 B1 | * | 2/2002 | Van Slyke | .......... H01L 27/3281 313/504 |

(Continued)

FOREIGN PATENT DOCUMENTS

JP  2014-96355 A   5/2014
KR  10-2015-0071642 A   6/2015

*Primary Examiner* — Lex Malsawma
(74) *Attorney, Agent, or Firm* — Lewis Roca Rothgerber Christie LLP

(57) ABSTRACT

An organic light-emitting display including a substrate, an insulating layer on the substrate, the substrate and the insulating layer having an opening therethrough penetrating, a pixel array on the insulating layer, the pixel array including a plurality of pixels that surround the opening, a first pixel adjacent to the opening from among the plurality of pixels includes a pixel electrode layer, an intermediate layer on the pixel electrode layer, and an opposite electrode layer on the intermediate layer, and a stepped portion on the substrate and adjacent to the opening, the stepped portion having an under-cut step, wherein the intermediate layer including an organic emission layer, and wherein at least one of the intermediate layer and the opposite electrode layer extends toward the opening and is disconnected by the stepped portion.

11 Claims, 32 Drawing Sheets

(56) References Cited

U.S. PATENT DOCUMENTS

| | | | |
|---|---|---|---|
| 6,626,721 B1* | 9/2003 | Van Slyke | H01L 27/3283 |
| | | | 313/504 |
| 7,630,122 B2* | 12/2009 | Uchida | G02F 1/1313 |
| | | | 359/296 |
| 2008/0079352 A1* | 4/2008 | Cok | H01L 27/3209 |
| | | | 313/503 |
| 2014/0133282 A1* | 5/2014 | Hamm | G04G 17/045 |
| | | | 368/241 |
| 2015/0060809 A1 | 3/2015 | Kim et al. | |
| 2015/0144934 A1 | 5/2015 | Rappoport et al. | |

\* cited by examiner

ORGANIC LIGHT-EMITTING DISPLAY AND METHOD OF MANUFACTURING THE SAME

CROSS-REFERENCE TO RELATED PATENT APPLICATION(S)

This application claims priority to and the benefit of Korean Patent Application No. 10-2015-0163351, filed on Nov. 20, 2015, and Korean Patent Application No. 10-2015-0191024, filed on Dec. 31, 2015, in the Korean Intellectual Property Office, the disclosures of which are incorporated herein in their entirety by reference.

BACKGROUND

1. Field

Aspects of the present invention are related to organic light-emitting displays and methods of manufacturing the same.

2. Description of the Related Art

Use of conventional display devices has become diversified with an increasing range of uses due in part to the relatively small thickness and relatively light weight of the display devices.

In particular, flat panel display devices have been recently studied and manufactured.

Given that display devices may be formed in a flat shape, various suitable methods may be used to design the shape of the display devices. There has also been an increase in the functions that may be applied or linked to the display devices.

SUMMARY

Aspects of one or more embodiments of the present invention are directed toward a display device including a through-hole (e.g., an opening).

Additional aspects will be set forth in part in the description which follows and, in part, will be apparent from the description, or may be learned by practice of the presented embodiments.

According to one or more exemplary embodiments, there is provided an organic light-emitting display including: a substrate; an insulating layer on the substrate, the substrate and the insulating layer having an opening therethrough penetrating; a pixel array on the insulating layer, the pixel array including a plurality of pixels that surround the opening, a first pixel adjacent to the opening from among the plurality of pixels includes a pixel electrode layer, an intermediate layer on the pixel electrode layer, and an opposite electrode layer on the intermediate layer; and a stepped portion on the substrate and adjacent to the opening, the stepped portion having an under-cut step, wherein the intermediate layer including an organic emission layer, and wherein at least one of the intermediate layer and the opposite electrode layer extends toward the opening and is disconnected by the stepped portion.

In an embodiment, the substrate has a first area corresponding to the opening, a second area corresponding to the pixel array, and a third area between the first area and the second area, and the stepped portion is in the third area.

In an embodiment, the insulating layer includes a recess that is concave in a thickness direction of the insulating layer, and the stepped portion is within the recess.

In an embodiment, the stepped portion includes: a first layer within the recess; and a second layer over the first layer, wherein a width of an upper portion of the first layer is less than a width of a lower portion of the second layer.

In an embodiment, the first layer and the second layer include different materials.

In an embodiment, the first layer includes metal.

In an embodiment, the first pixel further includes a pixel circuit electrically connected to the pixel electrode layer, and the pixel circuit includes a thin film transistor (TFT) including a gate electrode, an active layer, a source electrode, and a drain electrode, and the pixel circuit further includes a storage capacitor including a lower electrode and an upper electrode.

In an embodiment, the first layer includes a same material as that of one of the gate electrode, the source electrode, the drain electrode, the lower electrode, and the upper electrode.

In an embodiment, the second layer includes a same material as that of the insulating layer.

In an embodiment, a thickness of the first layer is greater than a thickness of the at least one layer.

In an embodiment, the organic light-emitting display further includes a protection layer that covers the at least one layer.

In an embodiment, the protection layer includes at least one of an organic layer and an inorganic layer, the organic layer including organic-inorganic composite particles.

According to one or more exemplary embodiments, there is provided a method of manufacturing an organic light-emitting display, the method including: forming an insulating layer on a substrate, the substrate having a first area, a second area, and a third area between the first area and the second area; forming a stepped portion in the third area of the substrate, the stepped portion having an under-cut step; forming a pixel array in the second area of the substrate and including a plurality of pixels; and forming an opening that corresponds to the first area and penetrates through the substrate and the insulating layer, wherein the forming of the pixel array includes: forming a pixel electrode layer; forming an intermediate layer on the pixel electrode layer, the intermediate layer including an organic emission layer; and forming an opposite electrode layer on the intermediate layer, and wherein at least one of the intermediate layer and the opposite electrode layer extends toward the opening and is disconnected by the stepped portion.

In an embodiment, the stepped portion includes a first layer metal and a second layer over the first layer, the first layer including metal, and a width of an upper surface of the first layer is less than a width of a lower surface of the second layer.

In an embodiment, the forming of the stepped portion includes: forming a preliminary first layer below the insulating layer; partially etching the insulating layer such that a portion of the insulating layer remaining over the preliminary first layer forms the second layer of the stepped portion and that an end of the preliminary first layer is exposed; and forming the first layer by removing the end of the preliminary first layer.

In an embodiment, the forming of the first layer and the forming of the pixel electrode layer are performed during a same etching process.

In an embodiment, the method further includes: forming a pixel circuit in the second area of the substrate, the pixel circuit being connected to the pixel electrode layer, the pixel circuit including a thin film transistor (TFT) including a gate electrode, an active layer, a source electrode, and a drain electrode, and the pixel circuit further including a storage capacitor including a lower electrode and an upper electrode.

In an embodiment, the first layer includes a same material as that of one of the gate electrode, the source electrode, the drain electrode, the lower electrode, and the upper electrode.

In an embodiment, a thickness of the first layer is greater than a thickness of the at least one layer.

In an embodiment, the method further includes forming a protection layer that covers a disconnected portion of the at least one layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
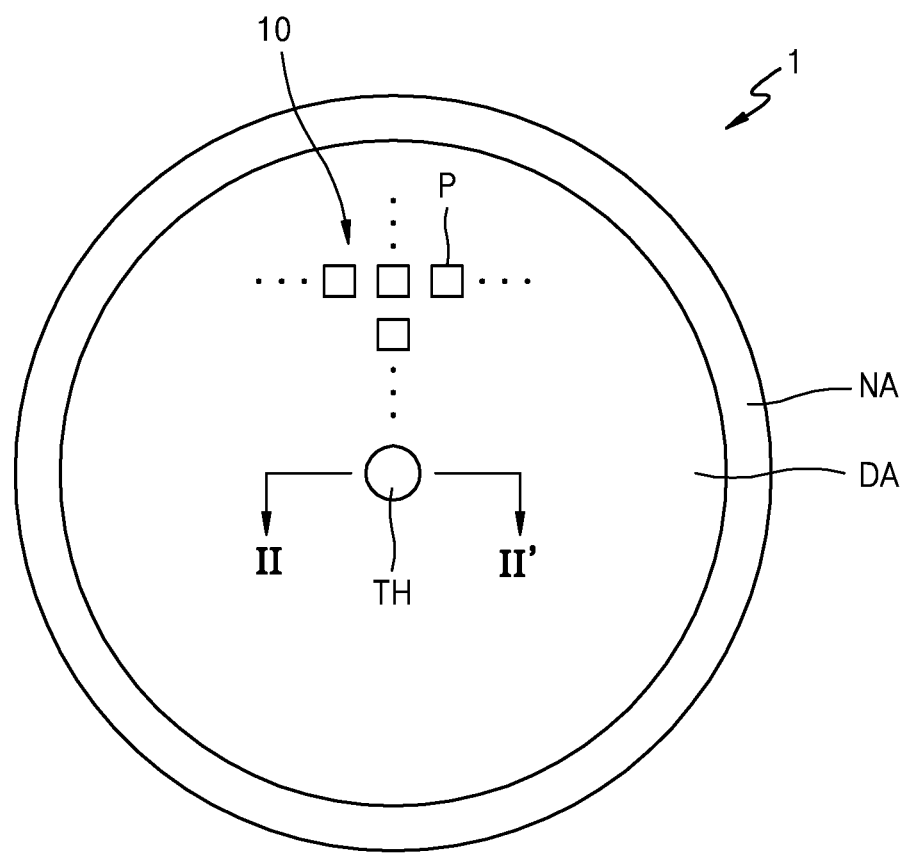
FIG. 1 is a schematic plan view of an organic light-emitting display according to an embodiment of the present invention.

As the invention allows for various suitable changes and numerous embodiments, particular embodiments will be illustrated in the drawings and described in detail in the written description. Hereinafter, effects and features of the present invention and a method for accomplishing them will be described more fully with reference to the accompanying drawings, in which exemplary embodiments of the invention are shown. This invention may, however, be embodied in many different forms and should not be construed as limited to the exemplary embodiments set forth herein.

One or more embodiments of the invention will be described below in more detail with reference to the accompanying drawings. Those components that are the same or are in correspondence are referenced using the same reference numerals regardless of the figure number, and repeat explanations may not be provided.

Sizes of elements in the drawings may be exaggerated for convenience of explanation. In other words, because sizes and thicknesses of components in the drawings are arbitrarily illustrated for convenience of explanation, the following embodiments are not limited thereto.

FIG. 1 is a schematic plan view of an organic light-emitting display 1 according to an embodiment of the present invention.

Referring to FIG. 1, the organic light-emitting display 1 includes a display area DA and a non-display area NA.

A through-hole (e.g., an opening) TH is in the display area DA, and a pixel array 10 including pixels P that surround the through-hole TH. Each pixel P of the pixel array 10 includes a pixel circuit and an organic light-emitting diode (OLED) electrically connected to the pixel circuit, and provides an image via light emitted by the OLED.

The non-display area NA may surround the display area DA, and a driving unit (e.g., a driver), such as a scan driving unit (e.g., a scan driver) and a data driving unit (e.g., a data driver), for transmitting a preset or predetermined signal to each pixel P of the display area DA.

Although the through-hole TH is in the center of the display area DA of the organic light-emitting display 1 in FIG. 1, embodiments are not limited thereto. The through-hole TH may be surrounded by the pixels P and at any location in the display area DA, but a location of the through-hole TH is not limited thereto.

In FIG. 1, the through-hole TH is circular, and one through-hole TH is formed. However, embodiments are not limited thereto. The through-hole TH may have any of various suitable shapes, for example, a polygon (e.g., a rectangle) and an oval, and the number of through-holes TH formed is not limited to one.

Although the display area DA is circular in FIG. 1, embodiments are not limited thereto. The display area DA may have any of various suitable shapes, for example, a polygon (e.g., a rectangle) and an oval.

Figure 2:
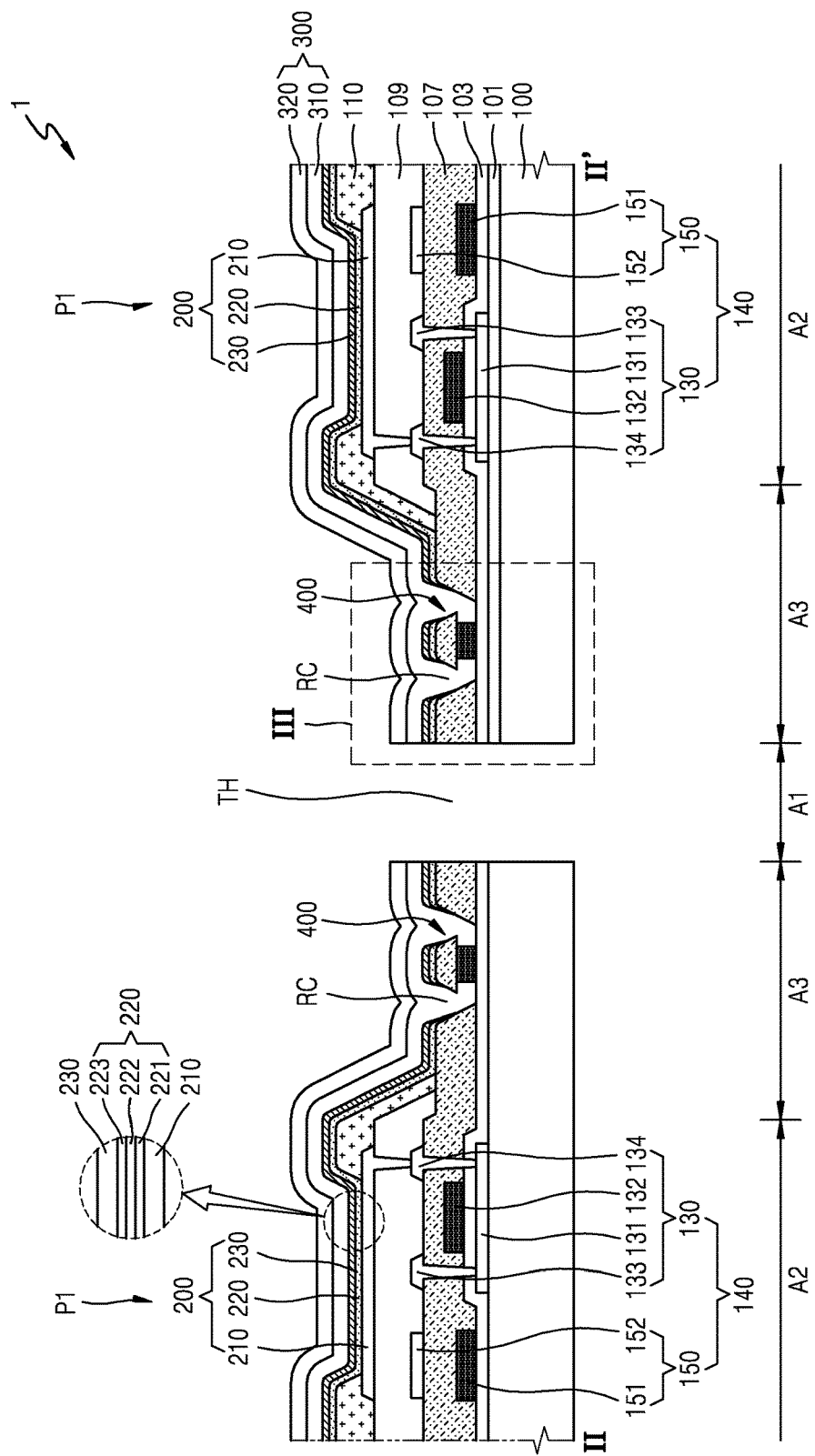
FIG. 2 is a cross-sectional view taken along the line II-II' of FIG. 1, which shows a cross-section of an organic light-emitting display according to an embodiment of the present invention.
Figure 3:
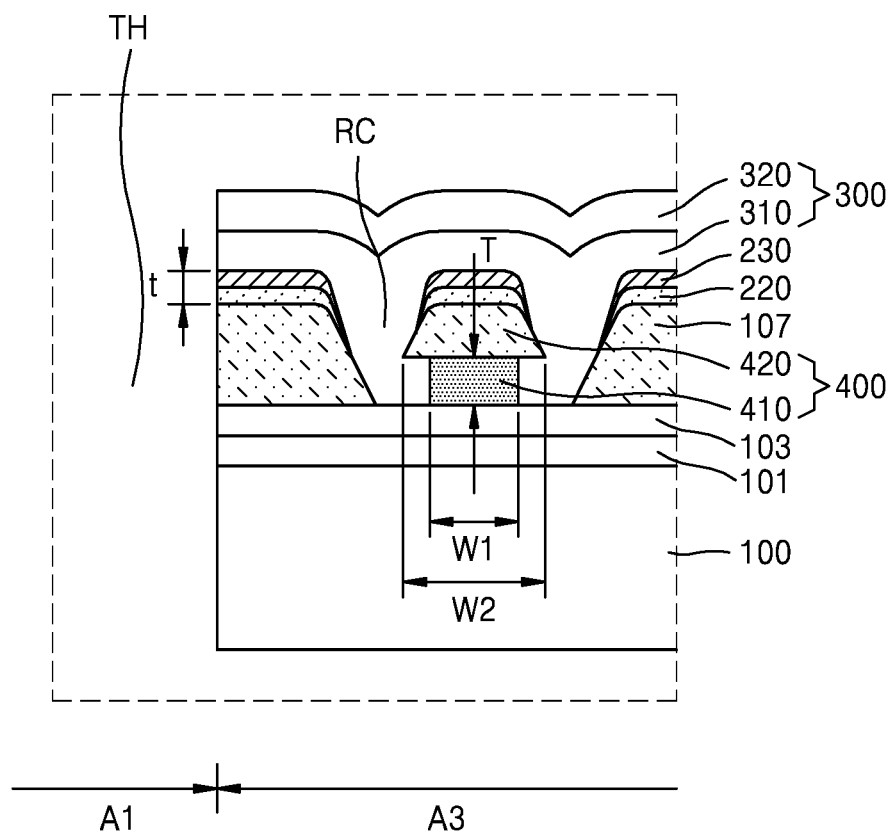
FIG. 3 is a cross-sectional view showing the region III extracted from the cross-section of FIG. 2.

FIG. 2 is a cross-sectional view taken along the line II-II' of FIG. 1, which shows a cross-section of the organic light-emitting display 1 according to an embodiment of the present invention. FIG. 3 is a cross-sectional view showing the region III extracted from the cross-section of FIG. 2.

Referring to FIG. 2, a substrate 100 may be formed of a material such as glass, metal, or an organic material. According to an embodiment, the substrate 100 may be formed of a flexible material. For example, the substrate 100 may be formed of a material, such as polyimide (PI) and/or the like, to be easily bent or rolled. This is only an example, and embodiments are not limited thereto.

The substrate 100 includes a first area A1 corresponding to the through-hole TH, a second area A2 in which the plurality of pixels P are positioned, and a third area A3 between the first area A1 and the second area A2.

The first area A1 of the substrate 100 is an area in which the through-hole TH is located, and the through-hole TH penetrates through the first area A1 of substrate 100. The through-hole TH also penetrates through a plurality of layers positioned on/over the substrate 100, for example, insulating layers, namely, a buffer layer 101, a gate insulating layer 103, and an interlayer insulating layer 107, an intermediate layer 220 including an organic emission layer, an opposite electrode layer 230, and a protection layer 300.

The plurality of pixels P is located in the second area A2 of the substrate 100. For convenience of explanation, FIG.

2 illustrates pixels P1 (hereinafter, referred to as first pixels) adjacent to the through-hole TH among the plurality of pixels P.

A buffer layer 101 is disposed on the substrate 100. The buffer layer 101 may reduce or prevent infiltration of a foreign material, moisture, or ambient air below the substrate 100 and may provide a flat surface to the substrate 100. The buffer layer 101 may include an inorganic material, such as oxide, nitride and/or the like.

A pixel circuit 140 including a thin film transistor (TFT) 130 and a storage capacitor 150 is positioned on the buffer layer 101.

The TFT 130 includes an active layer 131, a gate electrode 132, a source electrode 133, and a drain electrode 134. The gate insulating layer 103 is between the active layer 131 and the gate electrode 132, and the interlayer insulating layer 107 is between the gate electrode 132 and the source and drain electrodes 133 and 134. Although a top gate-type transistor in which the gate electrode 132 is disposed above the active layer 131 is illustrated in the present embodiment, embodiments are not limited thereto. According to another embodiment, the TFT 130 may be a bottom gate-type transistor.

The active layer 131 may include amorphous silicon, polycrystalline silicon, and/or the like. According to another embodiment, the active layer 131 may include oxide of at least one of indium (In), gallium (Ga), stannum (Sn), zirconium (Zr), vanadium (V), hafnium (Hf), cadmium (Cd), germanium (Ge), chromium (Cr), titanium (Ti), zinc (Zn), and/or the like.

The gate insulating layer 103 may include an inorganic material including oxide, nitride, and/or the like. For example, the gate insulating layer 103 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

The gate electrode 132 may include a low resistance metal material. For example, the gate electrode 132 may include a conductive material including molybdenum (Mo), aluminum (Al), copper (Cu), titanium (Ti), and/or the like, and may include a single layer or multi-layers including the aforementioned materials.

The interlayer insulating layer 107 may include an inorganic material including oxide, nitride, and/or the like. For example, the interlayer insulating layer 107 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

The source and drain electrodes 133 and 134 may include a conductive material. For example, each of the source and drain electrodes 133 and 134 may include a conductive material including molybdenum (Mo), aluminum (Al), copper (Cu), and/or titanium (Ti), and may include multiple layers or a single layer including the aforementioned materials. According to a non-restrictive embodiment, each of the source and drain electrodes 133 and 134 may have a multi-layer structure of Ti/Al/Ti.

The storage capacitor 150 includes a lower electrode 151 and an upper electrode 152 positioned on different layers with the interlayer insulating layer 107 therebetween. According to an embodiment, the lower electrode 151 may be disposed on the same layer on which the gate electrode 132 is disposed, and the upper electrode 152 may be disposed on the same layer on which the source and drain electrodes 133 and 134 are disposed.

An OLED 200 is electrically connected to the pixel circuit 140 with the planarization insulating layer 109 therebetween. The OLED 200 includes a pixel electrode layer 210, the intermediate layer 220 disposed on the pixel electrode layer 210, and the opposite electrode layer 230 disposed on the intermediate layer 220.

The pixel electrode layer 210 may be a transparent (or semi-transparent) electrode or a reflective electrode. The (semi-)transparent electrode may include indium tin oxide (ITO), indium zinc oxide (IZO), zinc oxide (ZnO), indium oxide ($In_2O_3$), indium gallium oxide (IGO), aluminum zinc oxide (AZO), and/or the like. The reflective electrode may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof, and may further include a layer formed of ITO, IZO, ZnO, $In_2O_3$, and/or the like on the reflective layer.

In the magnified portion of FIG. 2, the intermediate layer 220 may include an organic emission layer 222, and a first functional layer 221 and a second functional layer 223 respectively disposed above and below the organic emission layer 222.

The first functional layer 221 may include a hole transport layer (HTL) and/or a hole injection layer (HIL), and the second functional layer 223 may include an electron transport layer (ETL) and/or an electron injection layer (EIL). The intermediate layer 220 may selectively include the HTL, the HIL, the ETL, and the EIL according to some embodiments.

The opposite electrode layer 230 may be a reflective electrode or a transparent (or semi-transparent). The reflective electrode may include at least one of Li, Ca, LiF/Ca, LiF/Al, Al, Ag, and Mg. The transparent (or semi-transparent) electrode may include a layer formed of Li, Ca, LiF/Ca, LiF/AL, Al, Mg and/or a compound thereof, and may further include a layer formed of a transparent (or semi-transparent) material, such as ITO, IZO, ZnO, $In_2O_3$, and/or the like on the afore-mentioned layer.

At least one of the intermediate layer 220 and the opposite electrode layer 230 extends toward the through-hole TH and covers the third area A3 of the substrate 100 as shown in FIG. 2. According to the present embodiment, for convenience of explanation, both the intermediate layer 220 and the opposite electrode layer 230 extend toward the through-hole TH and cover the third area A3.

An interface between layers that constitute the intermediate layer 220 and the opposite electrode layer 230 may serve as a path via which external moisture permeates. When moisture permeates, the OLED 200 may be degraded.

A stepped portion 400 is located in the third area A3 of the substrate 100 and blocks the path via which external moisture permeates.

Referring to FIGS. 2 and 3, the stepped portion 400 is positioned within a recess RC included in the interlayer insulating layer 107. The recess RC is concave in a thickness direction of the interlayer insulating layer 107. The stepped portion 400 includes a first layer 410 and a second layer 420 disposed over the first layer 410, and has an undercut structure in which a width W1 of an upper surface (or upper portion) of the first layer 410 is less than a width W2 of a lower surface (or lower portion) of the second layer 420.

The intermediate layer 220 and the opposite electrode layer 230 are disconnected by the stepped portion 400 having an under-cut step in the third area A3. Because the intermediate layer 220 and the opposite electrode layer 230 are disconnected by the stepped portion 400, even when moisture permeates along the interface between the layers that constitute the intermediate layer 220 and the opposite electrode layer 230 via the through-hole TH, the moisture may be prevented or substantially prevented from heading toward the OLED 200.

A thickness T of the first layer 410 may be greater than a thickness t of at least one of the intermediate layer 220 and the opposite electrode layer 230. In this case, the disconnection of the intermediate layer 220 and the opposite electrode layer 230 may be more effectively induced.

The first layer 1 may include metal. For example, the first layer 410 may be disposed on the same layer on which the gate electrode 132 of the TFT 130 and/or the lower electrode 151 of the storage capacitor 150 are disposed, and may include the same or substantially the same material as that used to form the gate electrode 132 of the TFT 130 and/or the lower electrode 151 of the storage capacitor 150.

The second layer 420 may include the same or substantially the same material as that used to form the interlayer insulating layer 107.

The protection layer 300 is disposed on the substrate 100 and covers at least one of the intermediate layer 220 and the opposite electrode layer 230 disconnected by the stepped portion 400.

The protection layer 300 includes at least one of an inorganic layer 310 and an organic layer 320 including organic-inorganic composite particles.

The inorganic layer 310 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like.

The organic layer 320 including the organic-inorganic composite particles is an organic layer in which organic-inorganic composite particles are formed within a free volume. The organic layer 320 including the organic-inorganic composite particles may be formed, for example, by sequential vapor infiltration (SVI).

For example, an organic layer including acryl, polyolefin, polyimide (PI), polyurethane, polyethylene terephthalate (PET), polyethylene naphthalate (PEN), polybutylene terephthalate (PBT), polyethersulfone (PES), and/or the like is formed.

Thereafter, an inorganic material is infiltrated into the free volume existing within the organic layer to thereby form the organic layer 320 including the organic-inorganic composite particles. Inorganic particles infiltrated into the free volume are chemically combined with a chemical reactor of an organic material used to form the organic layer to thereby form the organic-inorganic composite particles. Barrier characteristics of blocking moisture via the organic-inorganic composite particles within the free volume may improve.

FIGS. 4A-4G are cross-sectional views illustrating a method of manufacturing an organic light-emitting display, according to an embodiment of the present invention. FIGS. 4A-4G correspond to a method of manufacturing the organic light-emitting display 1 shown in FIGS. 2 and 3.

Figure 4A:
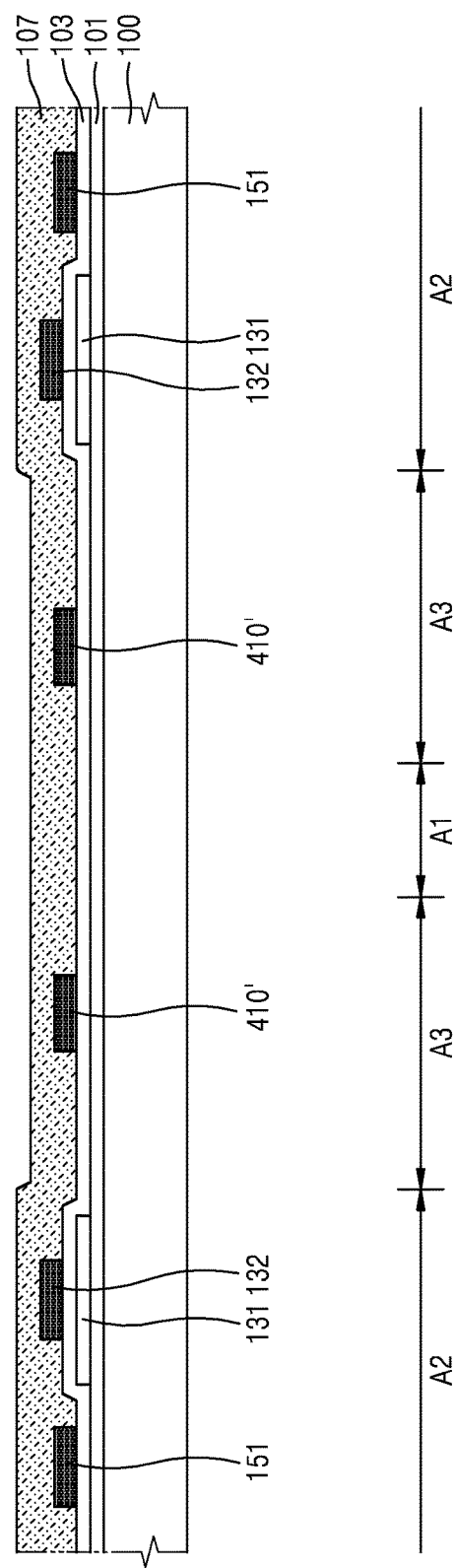
FIGS. 4A-4G are cross-sectional views illustrating a method of manufacturing an organic light-emitting display, according to an embodiment of the present invention.

Referring to FIG. 4A, the buffer layer 101 is formed on the substrate 100 including the first through third areas A1, A2, and A3, and a semiconductor layer is formed on the buffer layer 101 and then patterned to thereby form the active layer 131 in the second area A2. The buffer layer 101 may include an inorganic material such as oxide, nitride, and/or the like.

The active layer 131 may include amorphous silicon, polycrystalline silicon, and/or the like. According to another embodiment, the active layer 131 may include oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn).

Thereafter, the gate insulating layer 103 is formed on the substrate 100, and a metal layer is formed and then patterned to thereby form the gate electrode 132 of the TFT 130 in the second area A2, the lower electrode 151 of the storage capacitor 150 in the second area A2, and a preliminary first layer 410' in the third area A3.

The gate insulating layer 103 may include an inorganic material including oxide or nitride, and materials thereof are as described above.

The gate electrode 132, the lower electrode 151, and the preliminary first layer 410' are positioned on the same layer and include the same or substantially the same material. The preliminary first layer 410', the gate electrode 132, and the lower electrode 151 may include a low resistance metal material. For example, the preliminary first layer 410', the gate electrode 132, and the lower electrode 151 may include a conductive material including molybdenum (Mo), aluminum (Al), copper (Cu), titanium (Ti), and/or the like, and may include a single layer or multi-layers including the aforementioned materials.

Next, the interlayer insulating layer 107 is formed on the substrate 100. The interlayer insulating layer 107 may include an inorganic material including oxide or nitride, and materials thereof are as described above.

Figure 4B:
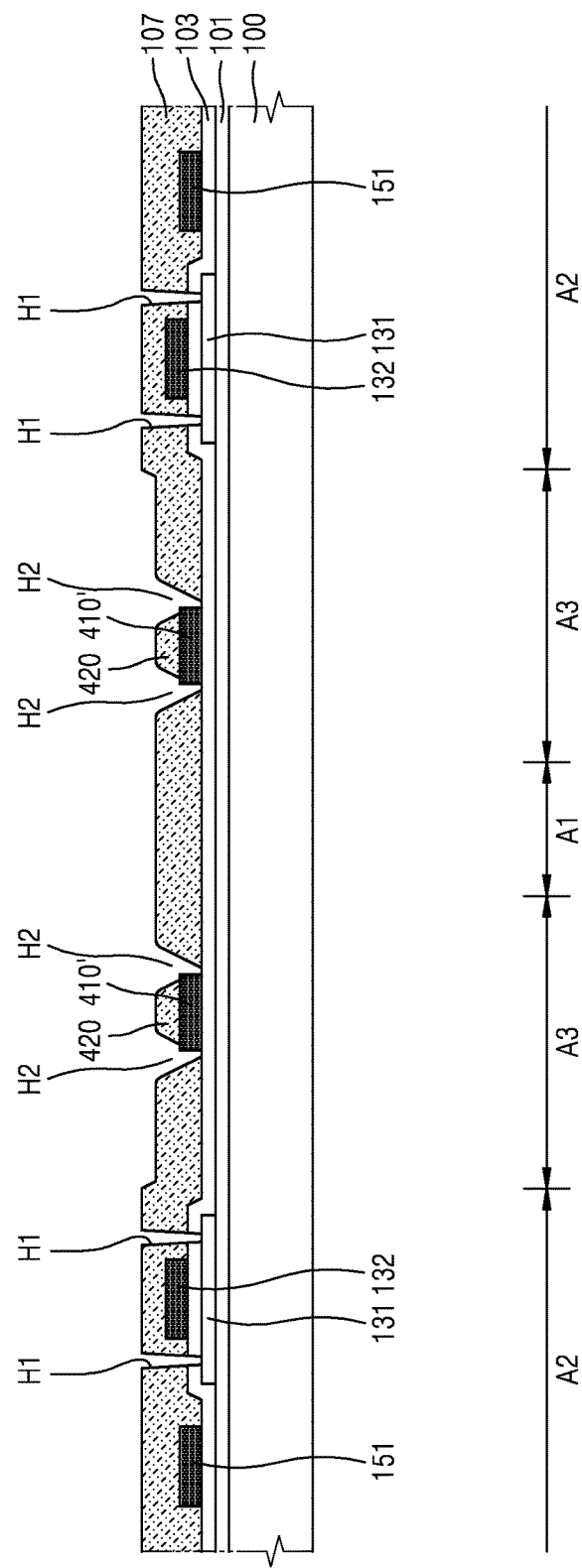

Referring to FIG. 4B, holes are formed in the interlayer insulating layer 107 via etching, for example. Via wet or dry etching, first holes H1 and second holes H2 are formed in the interlayer insulating layer 107. The first holes H1 are located in the second area A2, and the second holes H2 are located in the third area A3.

Some regions of the active layer 131 in the second area A2, for example, a source region and a drain region, are exposed via the first holes H1. An end of the preliminary first layer 410' in the third area A3 are exposed via the second holes H2.

During the etching process for forming the second holes H2, a portion of the interlayer insulating layer 107 remains on the preliminary first layer 410'. The portion of the interlayer insulating layer 107 remaining on the preliminary first layer 410' corresponds to the second layer 420 of the stepped portion 400 described above with reference to FIG. 2.

Figure 4C:
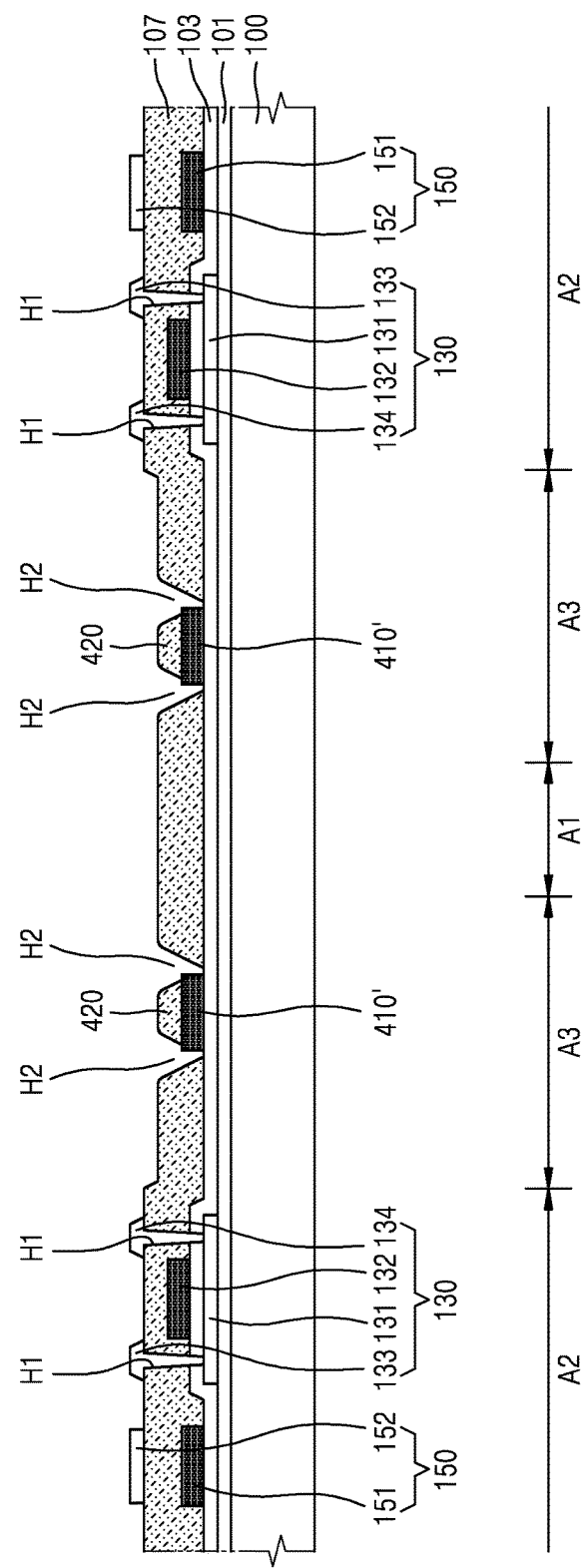

Referring to FIG. 4C, a metal layer is formed on the interlayer insulating layer 107 and then patterned to thereby form the source and drain electrodes 133 and 134 of the TFT 130 and the upper electrode 152 of the storage capacitor 150.

The source and drain electrodes 133 and 134 are connected to the some regions of the active layer 131, for example, the source region and the drain region, respectively, which are exposed via the first holes H1. The upper electrode 152 overlaps the lower electrode 151 with the interlayer insulating layer 107 therebetween.

The source and drain electrodes 133 and 134 and the upper electrode 152 are positioned on the same layer and include the same or substantially the same material. For example, the source and drain electrodes 133 and 134 and the upper electrode 152 may include a conductive material. For example, the source and drain electrodes 133 and 134 and the upper electrode 152 may include a conductive material including molybdenum (Mo), aluminum (Al), copper (Cu), titanium (Ti), and/or the like, and may include multiple layers or a single layer including the aforementioned materials. According to a non-restrictive embodiment, each of the source and drain electrodes 133 and 134 may have a multi-layer structure of Ti/Al/Ti.

Figure 4D:
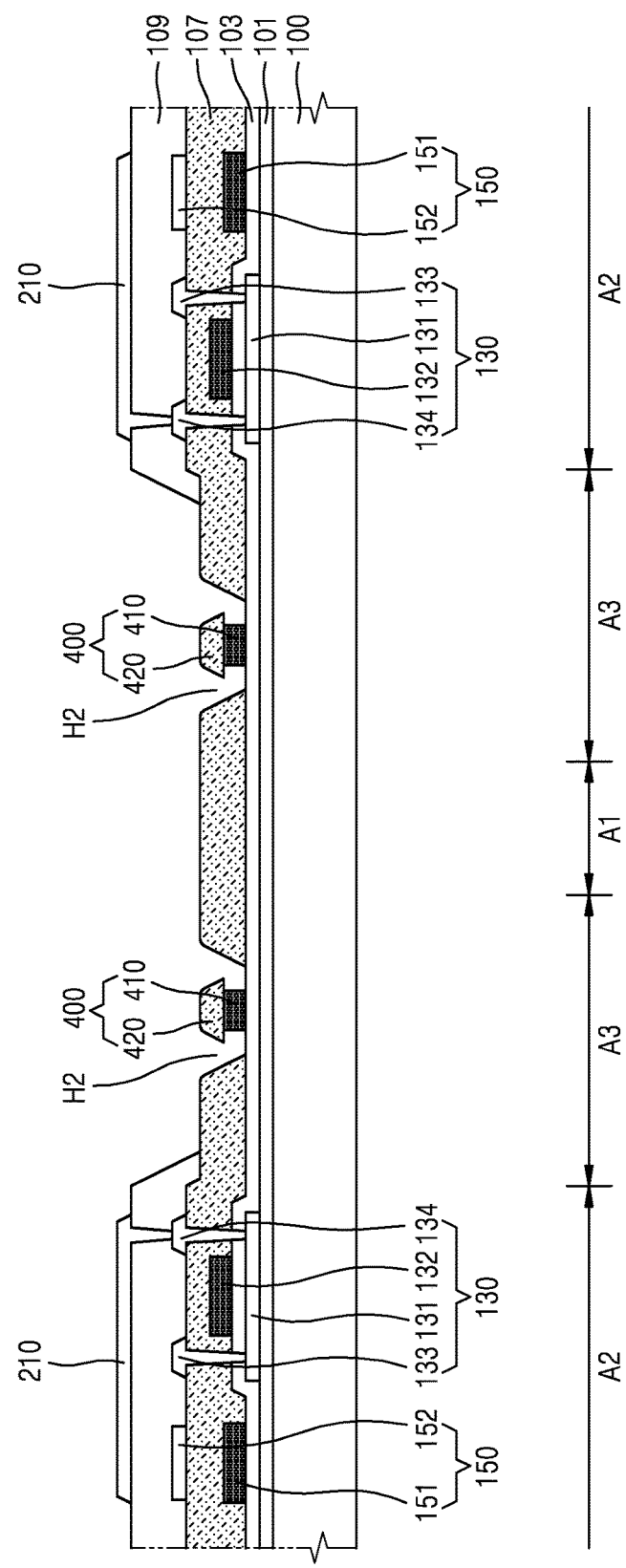

Referring to FIG. 4D, the planarization insulating layer 109 is formed in the second area A2 of the substrate 100.

The planarization insulating layer 109 may include a commarcial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, and/or the like.

Thereafter, a conductive layer is formed on the planarization insulating layer 109 and then patterned to form the pixel electrode layer 210. The conductive layer may be patterned via wet etching to form the pixel electrode layer 210.

During the formation of the pixel electrode layer 210, the stepped portion 400 is also formed. While the end of the preliminary first layer 410' exposed via the second holes H2 are being etched (under-cut etched) by an etchant used during the etching process for forming the pixel electrode layer 210, the first layer 410 is formed. The first layer 410 may be narrower than the second layer 420. Via undercut etching, the first layer 410 and the second layer 420 previously formed over the first layer 410 form the stepped portion 400. The upper surface (or upper portion) of the first layer 410 is narrower than the lower surface (or lower portion) of the second layer 420.

Figure 4E:
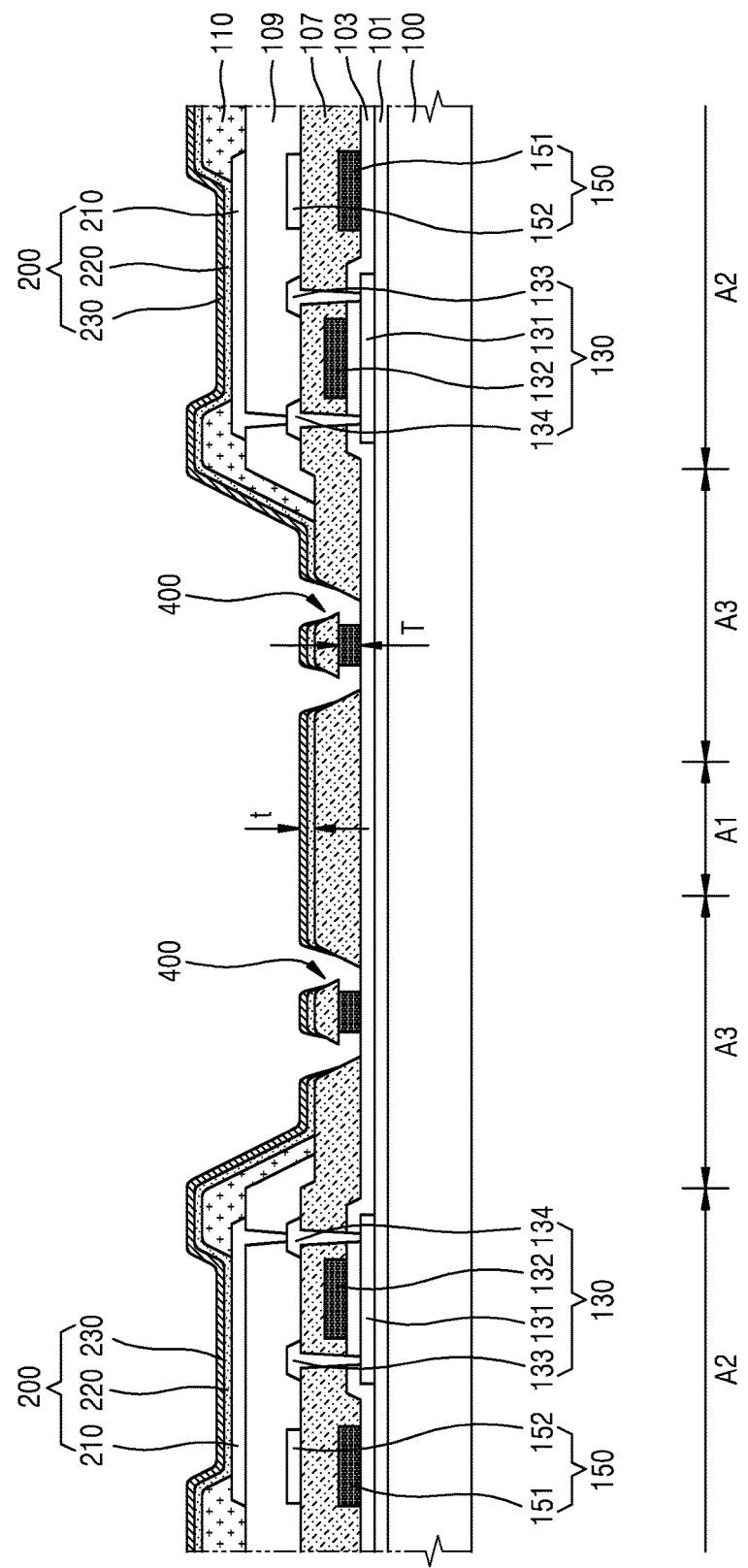

Referring to FIG. 4E, the pixel defining layer 110 exposing the pixel electrode layer 210 is formed on the substrate 100, and the intermediate layer 220 and the opposite electrode layer 230 are formed on the pixel defining layer 110.

At least one of the intermediate layer 220 and the opposite electrode layer 230 covers an entire upper surface of the substrate 100. For convenience of explanation, a case where both the intermediate layer 220 and the opposite electrode layer 230 cover the entire upper surface of the substrate 100 will now be described.

The intermediate layer 220 includes an organic emission layer. The intermediate layer 220 may further include at least one of an HTL, an HIL, an ETL, and an EIL according to embodiments. According to a non-restrictive embodiment, the intermediate layer 220 may be formed via a deposition process using a fine metal mask (FMM), and the opposite electrode layer 230 may be formed via vacuum deposition and/or the like.

During the formation of the intermediate layer 220 and the opposite electrode layer 230, the intermediate layer 220 and the opposite electrode layer 230 are disconnected by the stepped portion 400 having an under-cut structure. As described above, the disconnection may be effectively induced by forming the first layer 410 of the stepped portion 400 to have a greater thickness than at least one of the intermediate layer 220 and the opposite electrode layer 230.

Figure 4F:
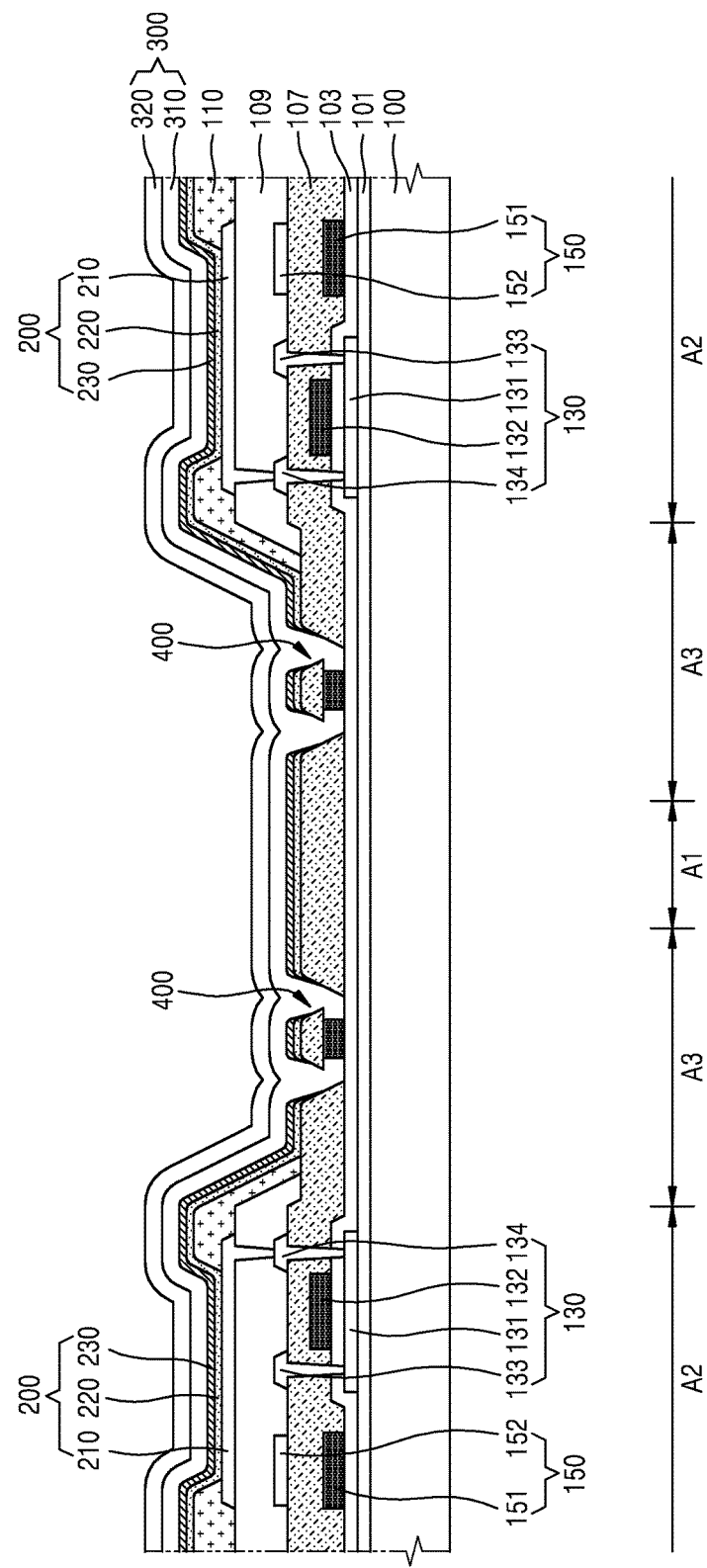

Referring to FIG. 4F, the protection layer 300 is formed on the substrate 100. The protection layer 300 includes at least one of the organic layer 320 including organic-inorganic composite particles and the inorganic layer 310.

The inorganic layer 310 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and/or the like, and may be formed by chemical vapor deposition.

The organic layer 320 including the organic-inorganic composite particles may be formed by SVI.

First, an organic layer including an organic material such as polymer is formed on the substrate 100. For example, the organic layer may include acryl, polyolefin, polyimide (PI), polyurethane, polyethylene terephthalate (PET), polyethylene naphthalate (PEN), polybutylene terephthalate (PBT), polyethersulfone (PES), and/or the like.

Then, an inorganic material is infiltrated into a free volume existing within the organic layer by SVI. The inorganic material may include Al, Si, and/or the like. The inorganic material infiltrated into the free volume is chemically combined with a chemical reactor of the organic layer to thereby form the organic-inorganic composite particles. The organic layer including the organic-inorganic composite particles has barrier characteristics of blocking moisture.

Figure 4G:
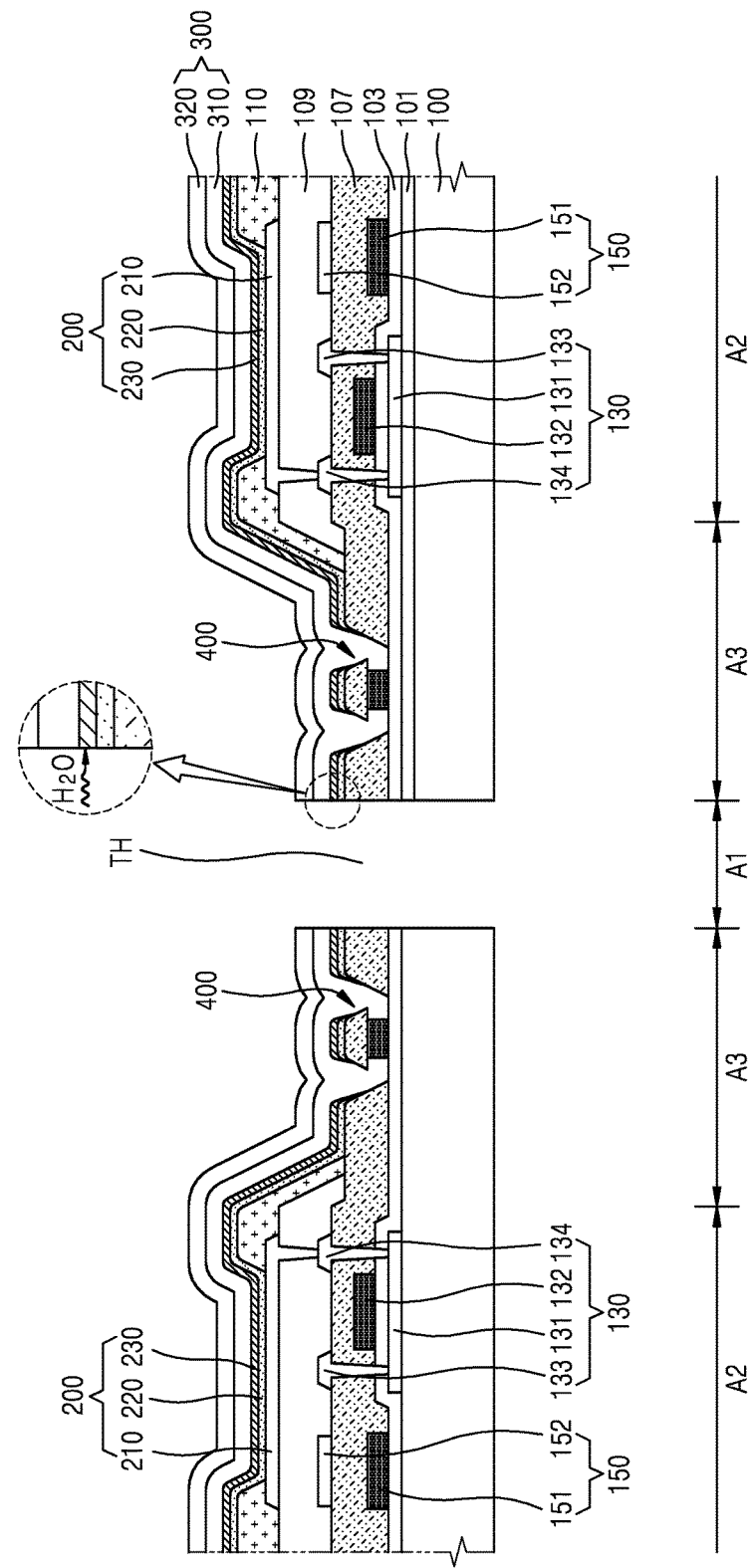

Referring to FIG. 4G, the through-hole (e.g., opening) TH penetrating through the first area Al of the substrate 100 is formed by using laser and/or the like.

In the magnified portion of FIG. 4G, the layers that constitute the intermediate layer 220 and the opposite electrode layer 230 are exposed via a process of forming the through-hole TH. External moisture $H_2O$ may head toward the OLED 200 via the interface between the layers exposed via the through-hole TH.

However, according to an embodiment, because the layers that constitute the intermediate layer 220 and the opposite electrode layer 230 are disconnected by the stepped portion 400, moisture infiltrated along the interface between the layers may be prevented or substantially prevented from heading toward the OLED 200.

Figure 5:
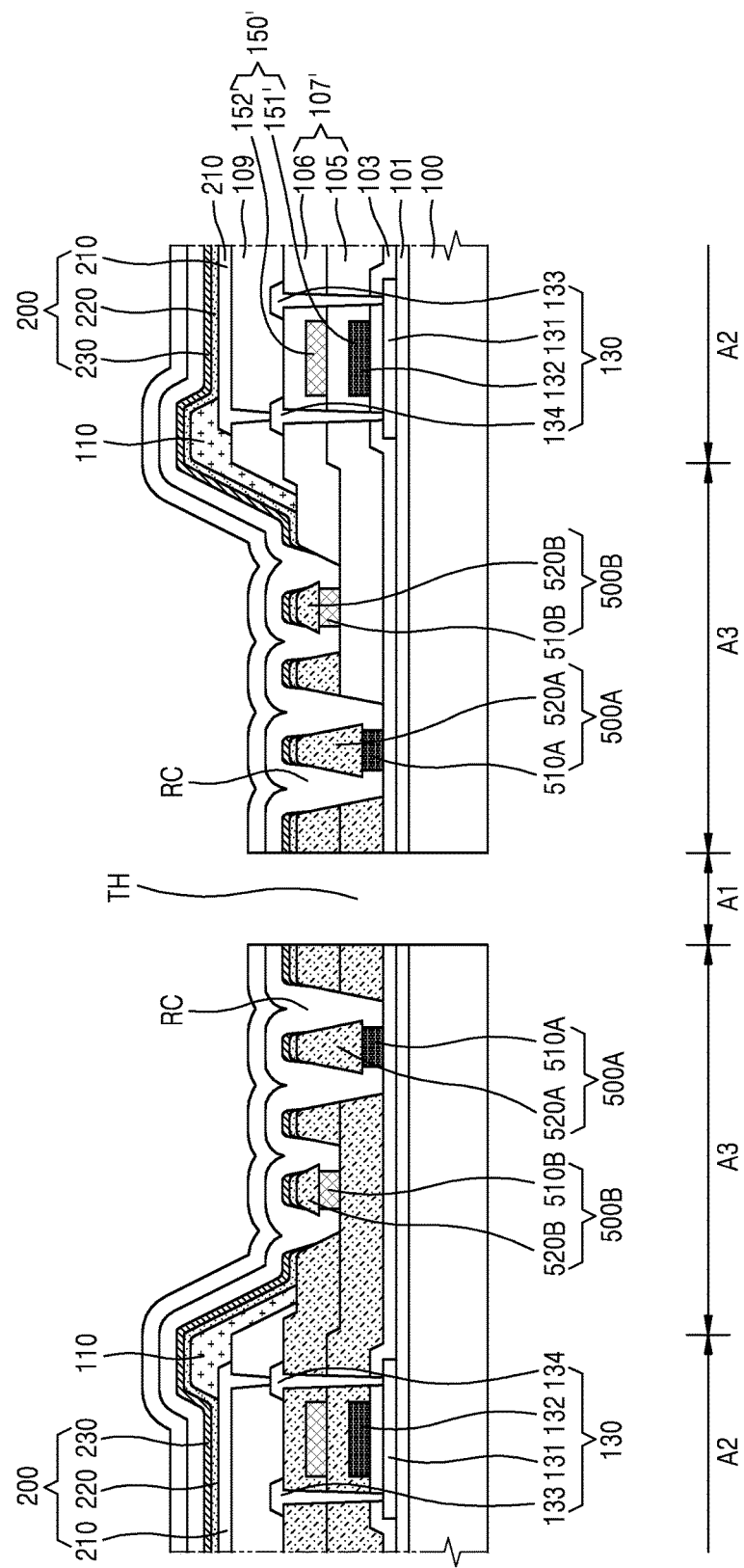
FIG. 5 is a cross-sectional view of an organic light-emitting display according to another embodiment of the present invention.

FIG. 5 is a cross-sectional view of an organic light-emitting display according to another embodiment of the present invention.

The organic light-emitting display of FIG. 5 is different from the organic light-emitting display 1 described above with reference to FIG. 2 in terms of a storage capacitor 150', an interlayer insulating layer 107', and stepped portions 400A and 400B. Differences therebetween will now be focused on and further described.

The storage capacitor 150' in the second area A2 of the substrate 100 may overlap the TFT 130.

According to an embodiment, a lower electrode 151' of the storage capacitor 150' may be disposed on the same layer on which the gate electrode 132 of the TFT 130 is disposed, and may include the same or substantially the same material as that used to form the gate electrode 132. For example, the gate electrode 132 of the TFT 130 may perform a function of the lower electrode 151' of the storage capacitor 150'.

According to an embodiment, an upper electrode 152' of the storage capacitor 150' may be disposed between the gate electrode 132 of the TFT 130 and the source and drain electrodes 133 and 134.

The upper electrode 152' may include a conductive material including molybdenum (Mo), aluminum (Al), copper (Cu), titanium (Ti), and/or the like, and may include multiple layers or a single layer including the aforementioned materials.

According to a non-restrictive embodiment, the upper electrode 152' may have a multi-layer structure of Mo/Al/Mo.

The interlayer insulating layer 107' may include a first interlayer insulating layer 105 between the lower electrode 151' and the upper electrode 152' of the storage capacitor 150', and a second interlayer insulating layer 106 between the upper electrode 152' of the storage capacitor 150' and the source and drain electrodes 133 and 134 of the TFT 130.

The first and second interlayer insulating layers 105 and 106 may include an inorganic material. The first and second interlayer insulating layers 105 and 106 may include oxide or nitride. For example, the first and second interlayer insulating layers 105 and 106 may include silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), and/or the like.

A recess RC included in the interlayer insulating layer 107' is located in the third area A3 of the substrate 100, and the plurality of stepped portions 500A and 500B having a undercut structure are included. For convenience of explanation, one of the plurality of stepped portions 500A and 500B is referred to as a first stepped portion 500A, and the other is referred to as a second stepped portion 500B.

The first stepped portion 500A includes a first layer 510A and a second layer 520A disposed over the first layer 510A, and has an undercut structure in which an upper surface (or upper portion) of the first layer 510A is narrower than a lower surface (or lower portion) of the second layer 520A.

During the formation of the intermediate layer 220 and the opposite electrode layer 230, the intermediate layer 220 and the opposite electrode layer 230 are disconnected by the first stepped portion 500A having an under-cut step. The first layer 510A of the first stepped portion 500A may be formed to have a greater thickness than at least one of the intermediate layer 220 and the opposite electrode layer 230, and thus the disconnection of the intermediate layer 220 and the opposite electrode layer 230 may be effectively induced.

The first layer 510A of the first stepped portion 500A may include metal. For example, the first layer 510A may be disposed on the same layer on which the gate electrode 132 of the TFT 130 and the lower electrode 151' of the storage capacitor 150' are disposed, and may include the same or substantially the same material as that used to form the gate electrode 132 of the TFT 130 and the lower electrode 151' of the storage capacitor 150'.

The second layer 520A of the first stepped portion 500A may include the same material as that used to form the interlayer insulating layer 107'. For example, the second layer 520A may be formed as a double layer including the same or substantially the same material as that used to form the first and second interlayer insulating layers 105 and 106.

The second stepped portion 500B includes a first layer 5106 and a second layer 520B disposed over the first layer 5106, and has an undercut structure in which an upper surface (or upper portion) of the first layer 5106 is narrower than a lower surface (or lower portion) of the second layer 520B.

During the formation of the intermediate layer 220 and the opposite electrode layer 230, the intermediate layer 220 and the opposite electrode layer 230 are disconnected by the second stepped portion 500B having an under-cut step. The first layer 5106 of the second stepped portion 500B may be formed to have a greater thickness than at least one of the intermediate layer 220 and the opposite electrode layer 230, and thus the disconnection of the intermediate layer 220 and the opposite electrode layer 230 may be effectively induced.

The first layer 5106 of the second stepped portion 500B may include metal. For example, the first layer 5106 may be disposed on the same layer on which the upper electrode 152' of the storage capacitor 150' is disposed, and may include the same or substantially the same material as that used to form the upper electrode 152' of the storage capacitor 150'.

The second layer 520B of the second stepped portion 500B may include the same or substantially the same material as that used to form the second interlayer insulating layer 106.

FIGS. 6A-6F are cross-sectional views illustrating a method of manufacturing an organic light-emitting display, according to another embodiment of the present invention. FIGS. 6A-7F correspond to a method of manufacturing the organic light-emitting display described above with reference to FIG. 5.

Figure 6A:
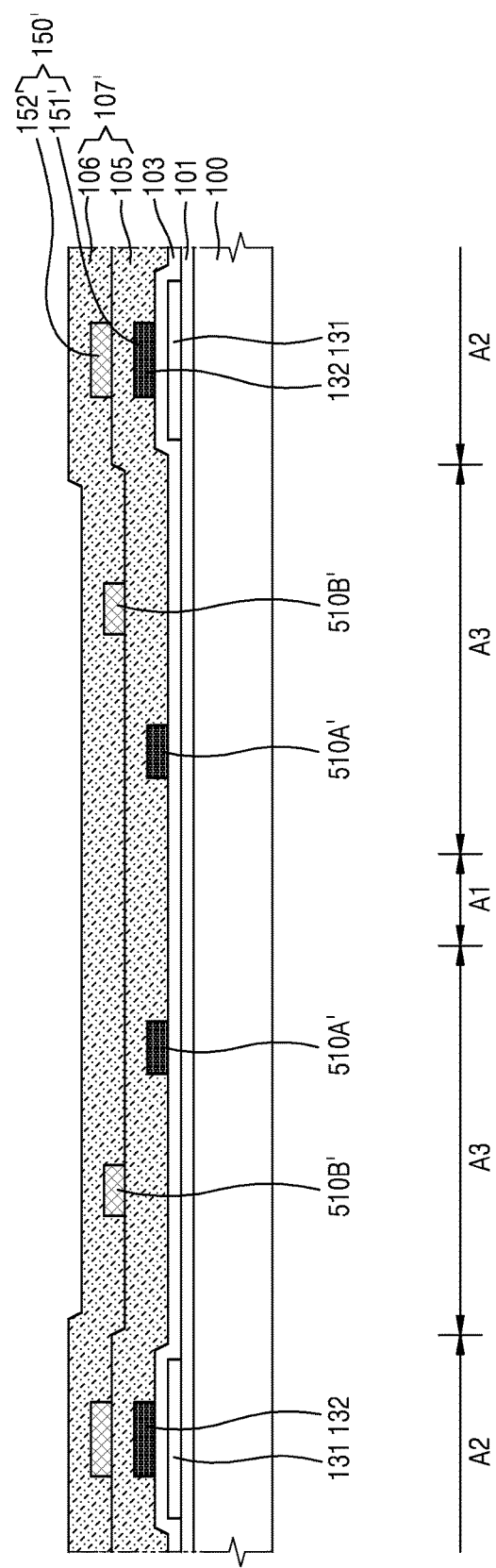
FIGS. 6A-6F are cross-sectional views illustrating a method of manufacturing an organic light-emitting display, according to another embodiment.

Referring to FIG. 6A, the buffer layer 101 is formed on the substrate 100 including the first through third areas A1, A2, and A3, and a semiconductor layer is formed on the buffer layer 101 and then patterned to thereby form the active layer 131 in the second area A2. Materials used to form the buffer layer 101 and the active layer 131 are as described above.

Thereafter, the gate insulating layer 103 is formed on the substrate 100, and a metal layer is formed and then patterned to thereby form the gate electrode 132 of the TFT 130 in the second area A2, the lower electrode 151' of the storage capacitor 150' in the second area A2, and a preliminary first layer 510A' (hereinafter, referred to as a first preliminary first layer) in the third area A3.

Next, the first interlayer insulating layer 105 is formed on the substrate 100, and a metal layer is formed and then patterned to thereby form the upper electrode 152' of the storage capacitor 150' in the second area A2 and a preliminary first layer 5106' (hereinafter, referred to as a second preliminary first layer) in the third area A3.

The first preliminary first layer 510A' is disposed on the same layer on which the gate electrode 132 of the TFT 130 and the lower electrode 151' of the storage capacitor 150' are disposed, and includes the same or substantially the same material as that used to form the gate electrode 132 of the TFT 130 and the lower electrode 151' of the storage capacitor 150'. The second preliminary first layer 5106' is disposed on the same layer on which the upper electrode 152' of the storage capacitor 150' is disposed, and includes the same or substantially the same material as that used to form the upper electrode 152' of the storage capacitor 150'.

The second interlayer insulating layer 106 is formed on the substrate 100 to cover the first preliminary first layer 510A' and the second preliminary first layer 510B'.

Figure 6B:
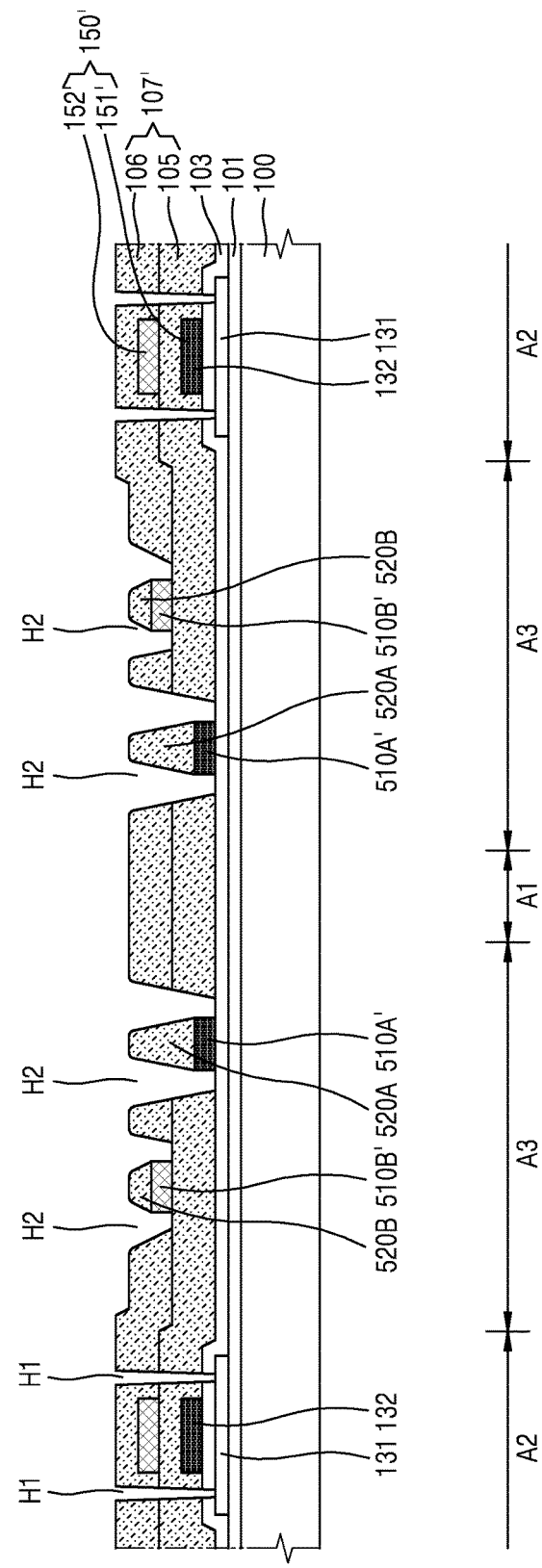

Referring to FIG. 6B, holes penetrating through the interlayer insulating layer 107' are formed via etching. For example, first holes H1 and second holes H2 penetrating through the first and second interlayer insulating layers 105 and 106 are formed via wet or dry etching. The first holes H1 are located in the second area A2, and the second holes H2 are located in the third area A3.

Some regions of the active layer 131 in the second area A2, for example, a source region and a drain region, are exposed via the first holes H1. Ends of the first and second preliminary first layers 510A' and 510B' in the third area A3 are exposed via the second holes H2.

Figure 6C:
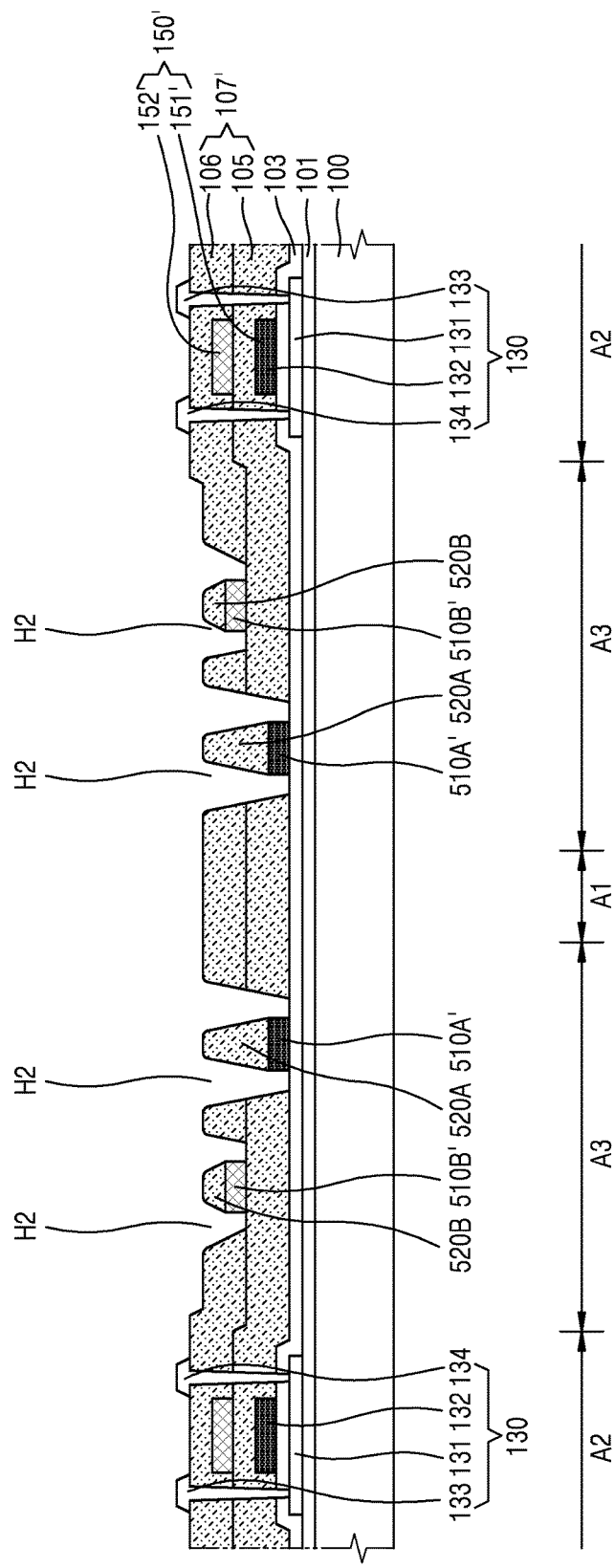

Referring to FIG. 6C, a metal layer is formed on the interlayer insulating layer 107' and then patterned to thereby form the source and drain electrodes 133 and 134 of the TFT 130. The source and drain electrodes 133 and 134 are respectively connected to the some regions of the active layer 131, for example, the source region and the drain region, exposed via the first holes H1 (see, e.g., FIG. 6B).

Figure 6D:
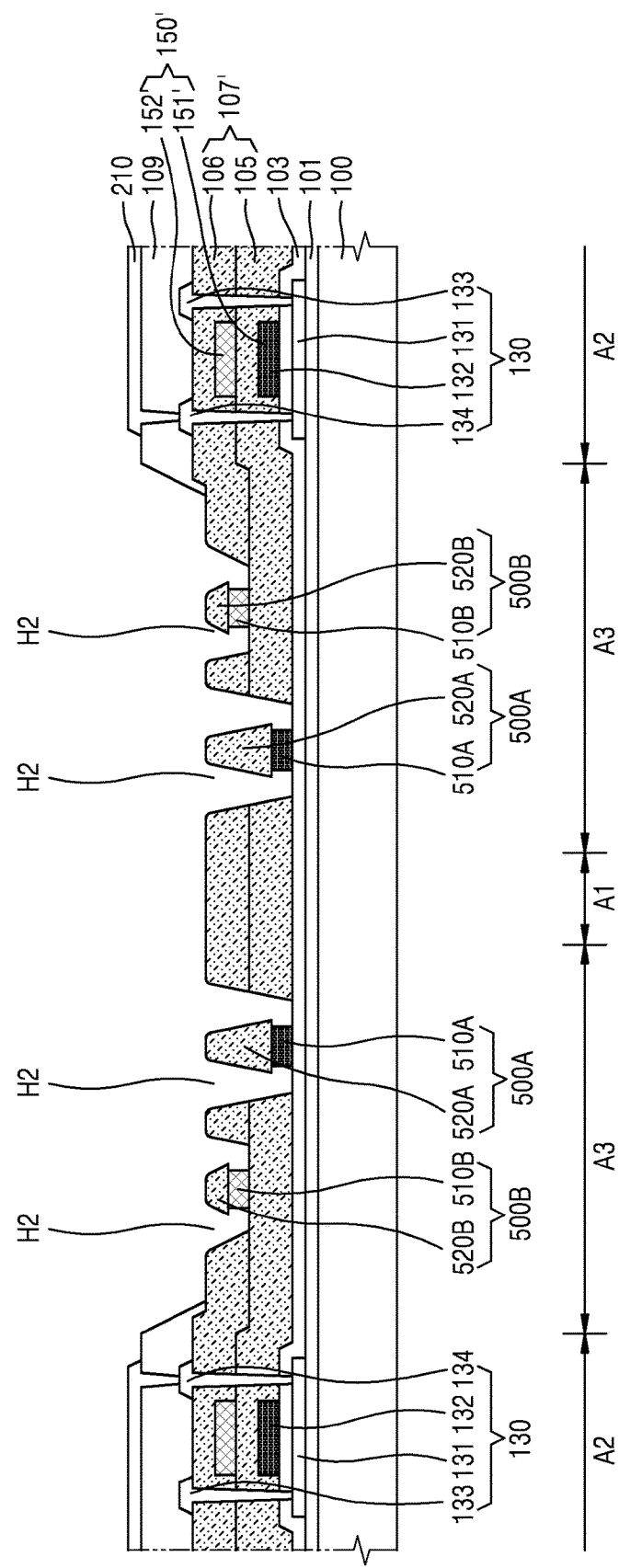

Referring to FIG. 6D, the planarization insulating layer 109 is formed in the second area A2 of the substrate 100, and a conductive layer is formed on the planarization insulating layer 109 and then patterned to form the pixel electrode layer 210.

During the formation of the pixel electrode layer 210, the first and second stepped portions 500A and 500B are also formed. For example, while the ends of the first and second preliminary first layer 510A' and 510B' exposed via the second holes H2 are being etched (under-cut etched) by an etchant used during the etching process for forming the pixel electrode layer 210, the first layers 510A and 510B, which are narrower than the second layers 520A and 5206, are formed.

The first layers 510A and 5106 and the second layers 520A and 520B form the first and second stepped portions 500A and 500B, respectively. The upper surfaces (or upper portions) of the first layers 510A and 5106 are narrower than the lower surfaces (or lower portions) of the second layers 520A and 520B.

Figure 6E:
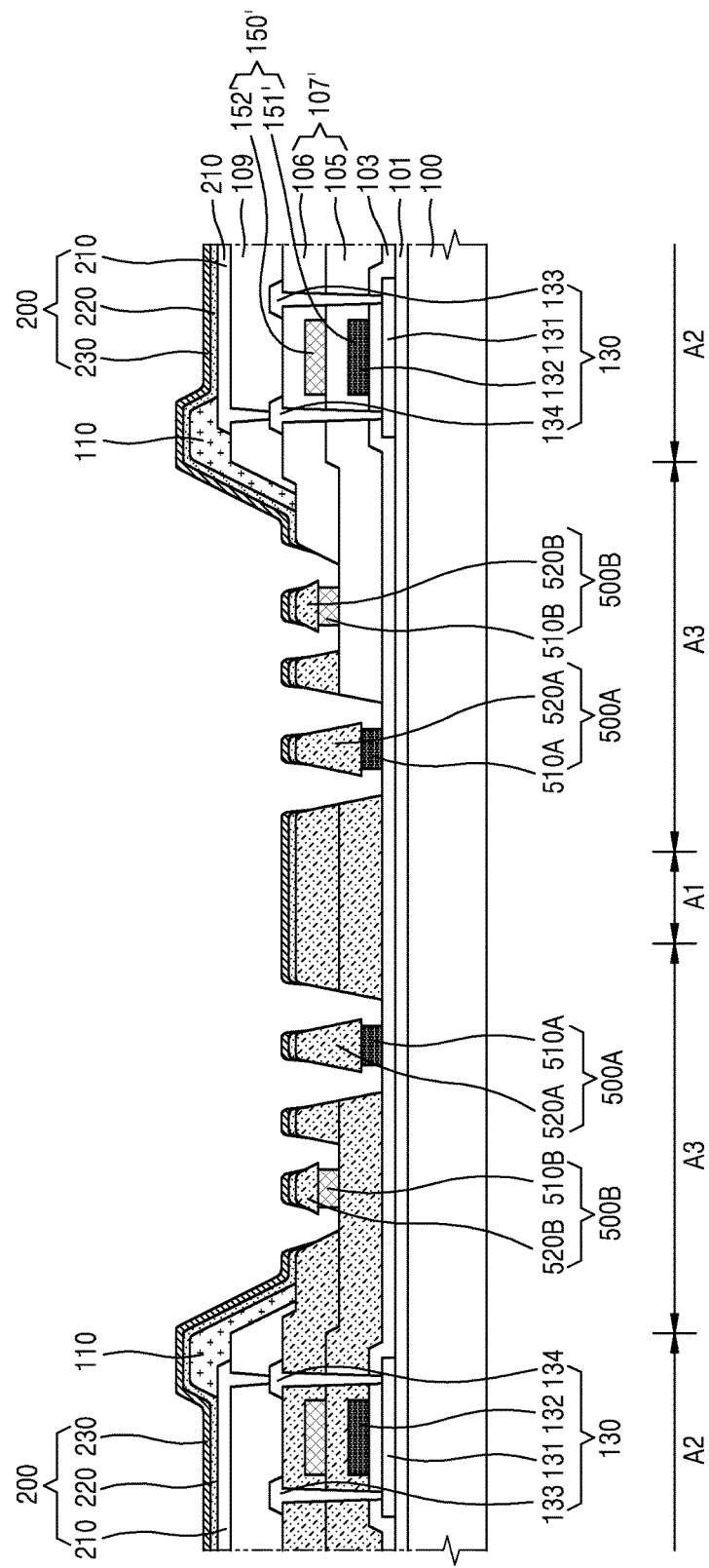

Referring to FIG. 6E, the pixel defining layer 110 exposing the pixel electrode layer 210 is formed on the substrate 100, and the intermediate layer 220 and the opposite electrode layer 230 are formed on the pixel defining layer 110. At least one of the intermediate layer 220 and the opposite electrode layer 230 covers an entire upper surface of the substrate 10, but is disconnected by the first and second stepped portions 500A and 500B.

Figure 6F:
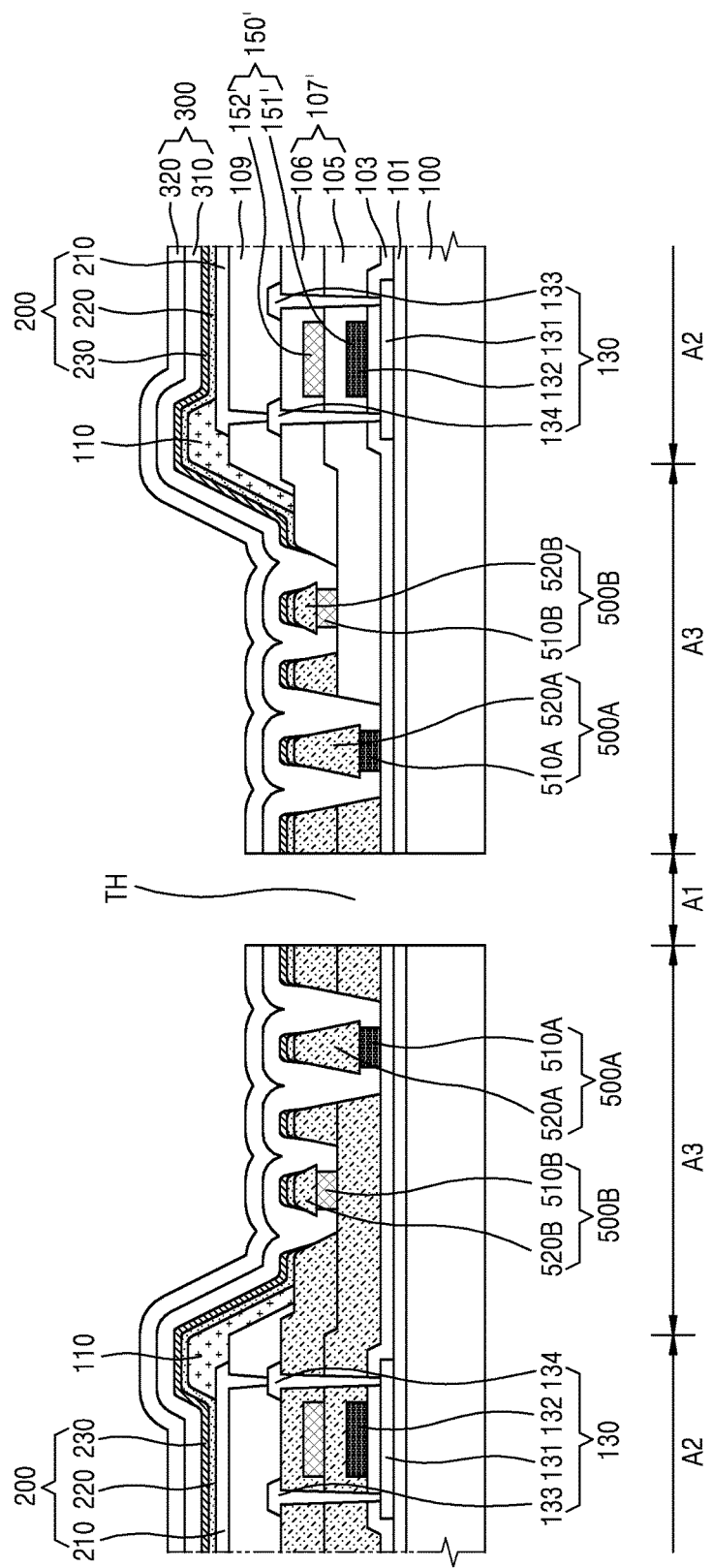

Referring to FIG. 6F, the protection layer 300 is formed on the substrate 100, and then the through-hole (e.g., the opening) TH penetrating through the first area A1 of the substrate 100 is formed.

The protection layer 300 includes at least one of the organic layer 320 including organic-inorganic composite particles and the inorganic layer 310, and materials thereof are as described above.

Figure 7:
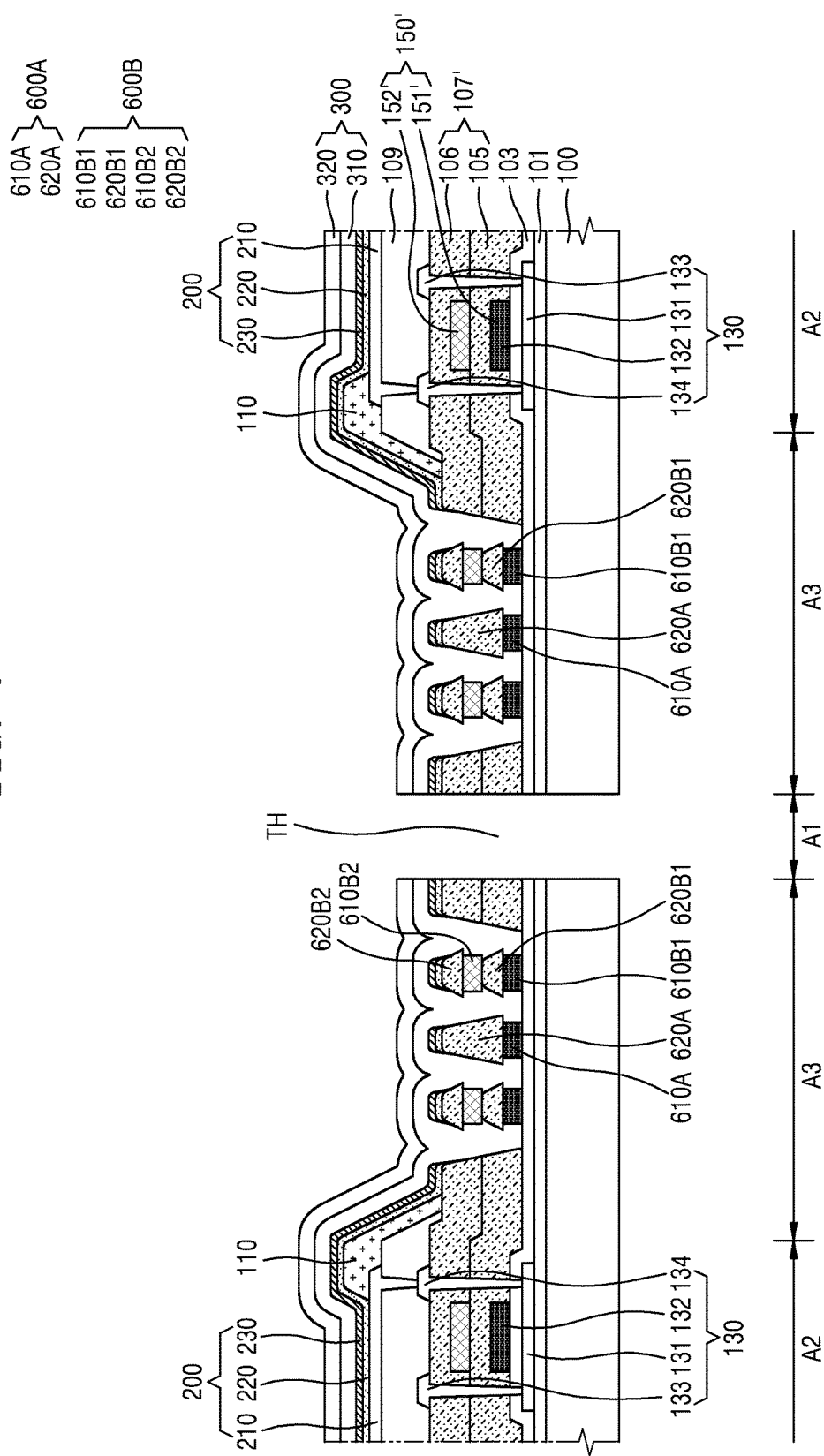
FIG. 7 is a cross-sectional view of an organic light-emitting display according to another embodiment of the present invention.

FIG. 7 is a cross-sectional view of an organic light-emitting display according to another embodiment of the present invention.

The organic light-emitting display of FIG. 7 is different from the organic light-emitting display of FIG. 5 in terms of the structure of a stepped portion. Differences therebetween will now be focused on and further described.

A first stepped portion 600A includes a first layer 610A and a second layer 620A disposed over the first layer 610A, and has an undercut structure in which an upper surface (or upper portion) of the first layer 610A is narrower than a lower surface (or lower portion) of the second layer 620A.

During the formation of the intermediate layer 220 and the opposite electrode layer 230, the intermediate layer 220 and the opposite electrode layer 230 are disconnected by the first stepped portion 600A having an under-cut step. The first layer 610A of the first stepped portion 600A may be formed to have a greater thickness than at least one of the intermediate layer 220 and the opposite electrode layer 230, and thus the disconnection of the intermediate layer 220 and the opposite electrode layer 230 may be effectively induced.

The first layer 610A of the first stepped portion 600A may include metal. For example, the first layer 610A may be disposed on the same layer on which the gate electrode 132 of the TFT 130 and the lower electrode 151' of the storage capacitor 150' are disposed, and may include the same or substantially the same material as that used to form the gate electrode 132 of the TFT 130 and the lower electrode 151' of the storage capacitor 150'.

The second layer 620A of the first stepped portion 600A may include the same or substantially the same material as that used to form the interlayer insulating layer 107'. For example, the second layer 620A may be formed as a double layer including the same or substantially the same material as that used to form the first and second interlayer insulating layers 105 and 106.

The second stepped portion 6006 may include first layers 610B1 and 610B2 and second layers 620B1 and 620B2S that are alternately stacked one on another. Upper surfaces (or upper portions) of the first layers 610B1 and 610B2 are narrower than lower surfaces (or lower portions) of the second layers 620B1 and 620B2 directly above the first layers 610B1 and 610B2, respectively.

During the formation of the intermediate layer 220 and the opposite electrode layer 230, the intermediate layer 220 and the opposite electrode layer 230 are disconnected by the second stepped portion 6006 having an under-cut step. The first layer 610B1, the second layer 620B1, and the first layer 610B2 disposed below the second layer 620B2 corresponding to an uppermost layer of the second stepped portion 600B may be thicker than at least one of the intermediate layer 220 and the opposite electrode layer 230, and thus the disconnection of the intermediate layer 220 and the opposite electrode layer 230 may be effectively induced.

The first layers 610B1 and 610B2 of the second stepped portion 600B may include metal. For example, the first layer 610B1 may be disposed on the same layer on which the gate electrode 132 of the TFT 130 and the lower electrode 151' of the storage capacitor 150' are disposed, and may include the same or substantially the same material as that used to form the gate electrode 132 of the TFT 130 and the lower electrode 151' of the storage capacitor 150'. The first layer 610B2 may be disposed on the same layer on which the upper electrode 152' of the storage capacitor 150' is disposed, and may include the same or substantially the same material as that used to form the upper electrode 152' of the storage capacitor 150'.

The second layers 620B1 and 620B2 of the second stepped portion 600B may include an insulative material used to form the insulating layer 107'. For example, the second layer 620B1 may be disposed on the same layer on which the first interlayer insulating layer 105 is disposed, and may include the same or substantially the same material as that used to form the first interlayer insulating layer 105. The second layer 620B2 may be disposed on the same layer on which the second interlayer insulating layer 106 is disposed, and may include the same or substantially the same material as that used to form the second interlayer insulating layer 106.

FIGS. 8A-8E are cross-sectional views illustrating a method of manufacturing an organic light-emitting display, according to another embodiment of the present invention. FIGS. 8A-8E correspond to a method of manufacturing the organic light-emitting display described above with reference to FIG. 7.

Figure 8A:
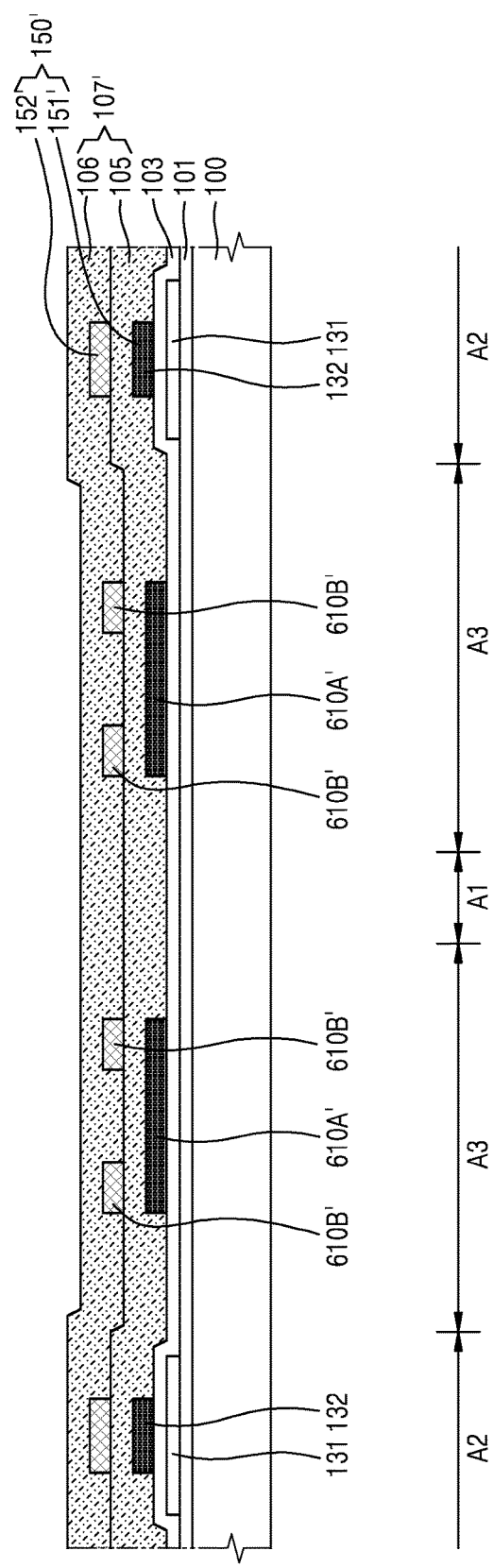
FIGS. 8A-8E are cross-sectional views illustrating a method of manufacturing an organic light-emitting display, according to another embodiment of the present invention.

Referring to FIG. 8A, the buffer layer 101 is formed on the substrate 100 including the first through third areas A1, A2, and A3, and a semiconductor layer is formed on the buffer layer 101 and then patterned to thereby form the active layer 131 in the second area A2. Materials used to form the buffer layer 101 and the active layer 131 are as described above.

Thereafter, the gate insulating layer 103 is formed on the substrate 100, and a metal layer is formed and then patterned to thereby form the gate electrode 132 of the TFT 130 in the second area A2, the lower electrode 151' of the storage capacitor 150' in the second area A2, and a preliminary first layer 610A' (hereinafter, referred to as a first preliminary first layer) in the third area A3.

Next, the first interlayer insulating layer 105 is formed on the substrate 100, and a metal layer is formed and then patterned to thereby form the upper electrode 152' of the storage capacitor 150' in the second area A2 and a preliminary first layer 610B' (hereinafter, referred to as a second preliminary first layer) in the third area A3.

The first preliminary first layer 610A' is disposed on the same layer on which the gate electrode 132 of the TFT 130 and the lower electrode 151' of the storage capacitor 150' are disposed, and includes the same or substantially the same material as that used to form the gate electrode 132 of the TFT 130 and the lower electrode 151' of the storage capacitor 150'. The second preliminary first layer 610B' is disposed on the same layer on which the upper electrode 152' of the storage capacitor 150' is disposed, and includes the same or substantially the same material as that used to form the upper electrode 152' of the storage capacitor 150'. The second preliminary first layer 610B' may overlap a portion of the first preliminary first layer 610A'.

The second interlayer insulating layer 106 is formed on the substrate 100 to cover the first preliminary first layer 610A' and the second preliminary first layer 610B'.

Figure 8B:
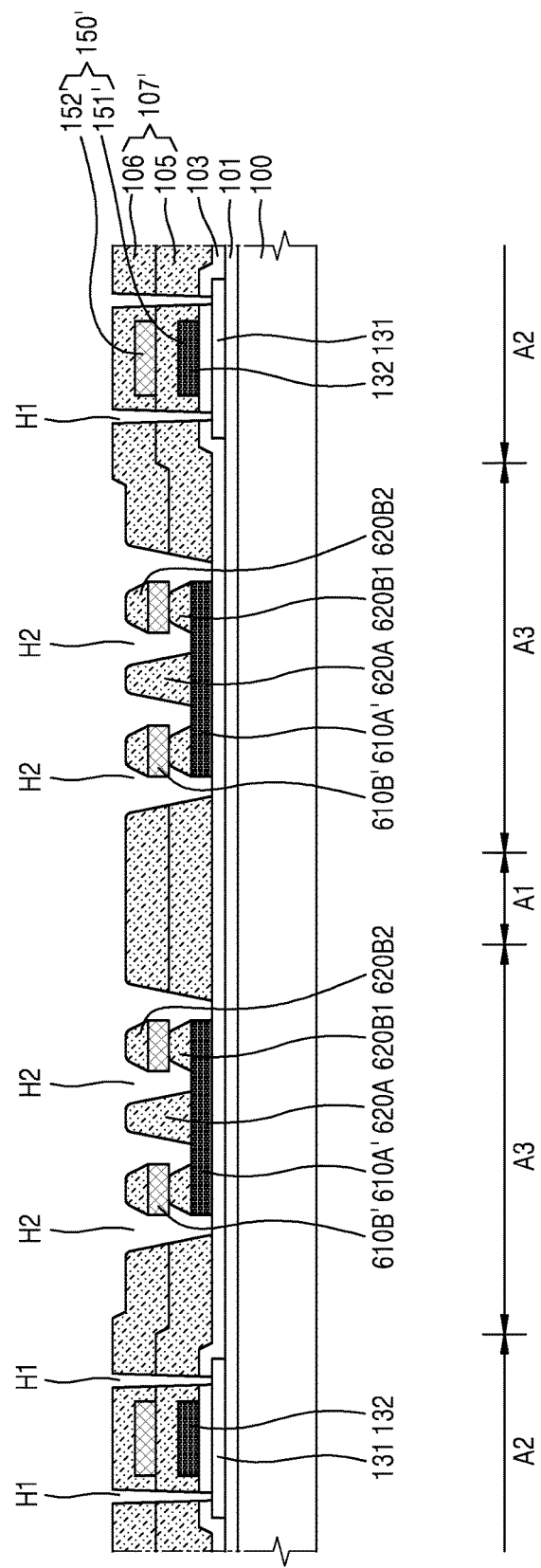

Referring to FIG. 8B, holes penetrating through the interlayer insulating layer 107' are formed via etching. For example, first holes H1 and second holes H2 penetrating through the first and second interlayer insulating layers 105 and 106 are formed via wet or dry etching. The first holes H1 are located in the second area A2, and the second holes H2 are located in the third area A3.

Some regions of the active layer 131 in the second area A2, for example, a source region and a drain region, are exposed via the first holes H1. Ends of the first and second preliminary first layers 610A' and 610B' in the third area A3 are exposed via the second holes H2, and insulating layers remain on the first preliminary first layer 610A' and the second preliminary first layer 610B'. The remaining insulating layers form the second layers 620A, 620B1, and 620B2 of the first and second stepped portions 600A and 600B, which will be described later.

Figure 8C:
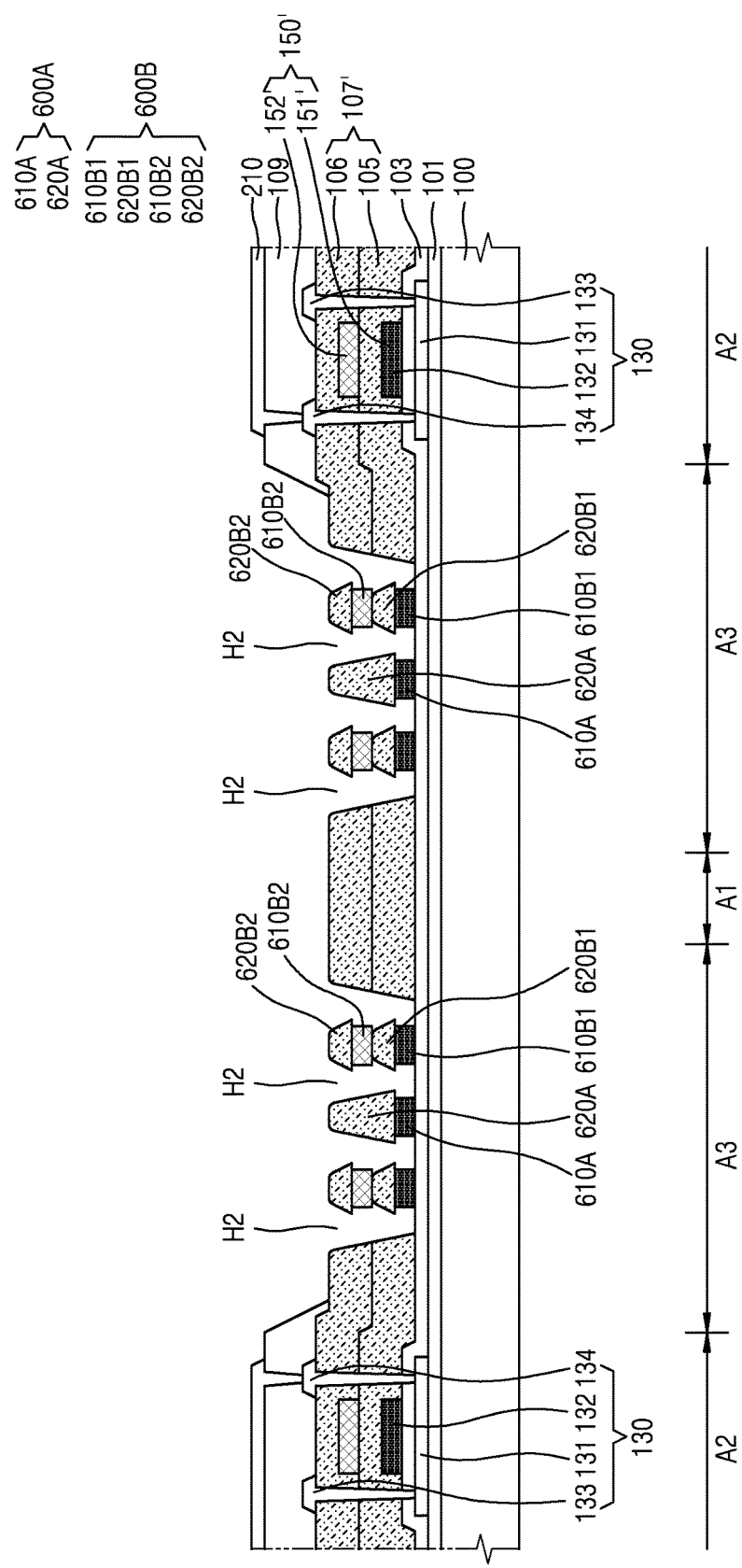

Referring to FIG. 8C, a metal layer is formed on the interlayer insulating layer 107' and then patterned to thereby form the source and drain electrodes 133 and 134 of the TFT 130. The source and drain electrodes 133 and 134 are respectively connected to the some regions of the active layer 131, for example, the source region and the drain region, exposed via the first holes H1 (see, e.g., FIG. 8B).

Then, the planarization insulating layer 109 is formed in the second area A2 of the substrate 100, and a conductive layer is formed on the planarization insulating layer 109 and then patterned to form the pixel electrode layer 210.

During the formation of the pixel electrode layer 210, the first and second stepped portions 600A and 600B are also formed. For example, while the ends of the first and second preliminary first layer 610A' and 610B' exposed via the second holes H2 are being etched (under-cut etched) by an etchant used during the etching process for forming the pixel electrode layer 210, the first layers 610A, 610B1, and 610B2, which are narrower than the second layers 620A, 620B1, and 620B2, are formed.

The first layers 610A, 610B1, and 610B2 and the second layers 620A, 620B1, and 620B2 having different widths via undercut etching form the first and second stepped portions 600A and 600B. An upper surface (or upper portion) of each of the first layers 610A, 610B1, and 610B2 is narrower than a lower surface (or lower portion) of each of the second layers 620A, 620B1, and 620B2.

Figure 8D:
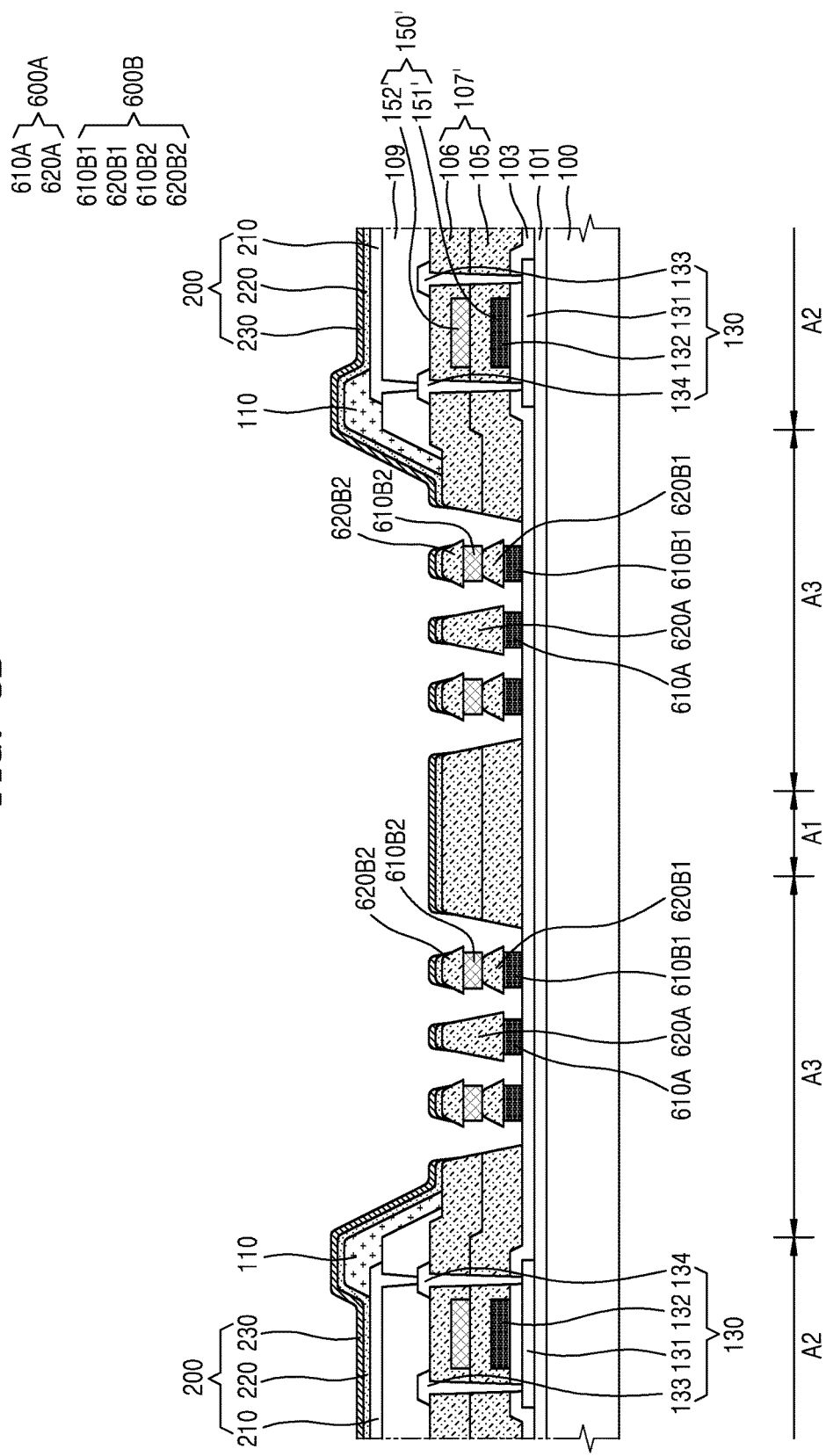

Referring to FIG. 8D, the pixel defining layer 110 exposing the pixel electrode layer 210 is formed on the substrate 100, and the intermediate layer 220 and the opposite electrode layer 230 are formed on the pixel defining layer 110. At least one of the intermediate layer 220 and the opposite electrode layer 230 covers an entire upper surface of the substrate 10, but is disconnected by the first and second stepped portions 600A and 600B.

Figure 8E:
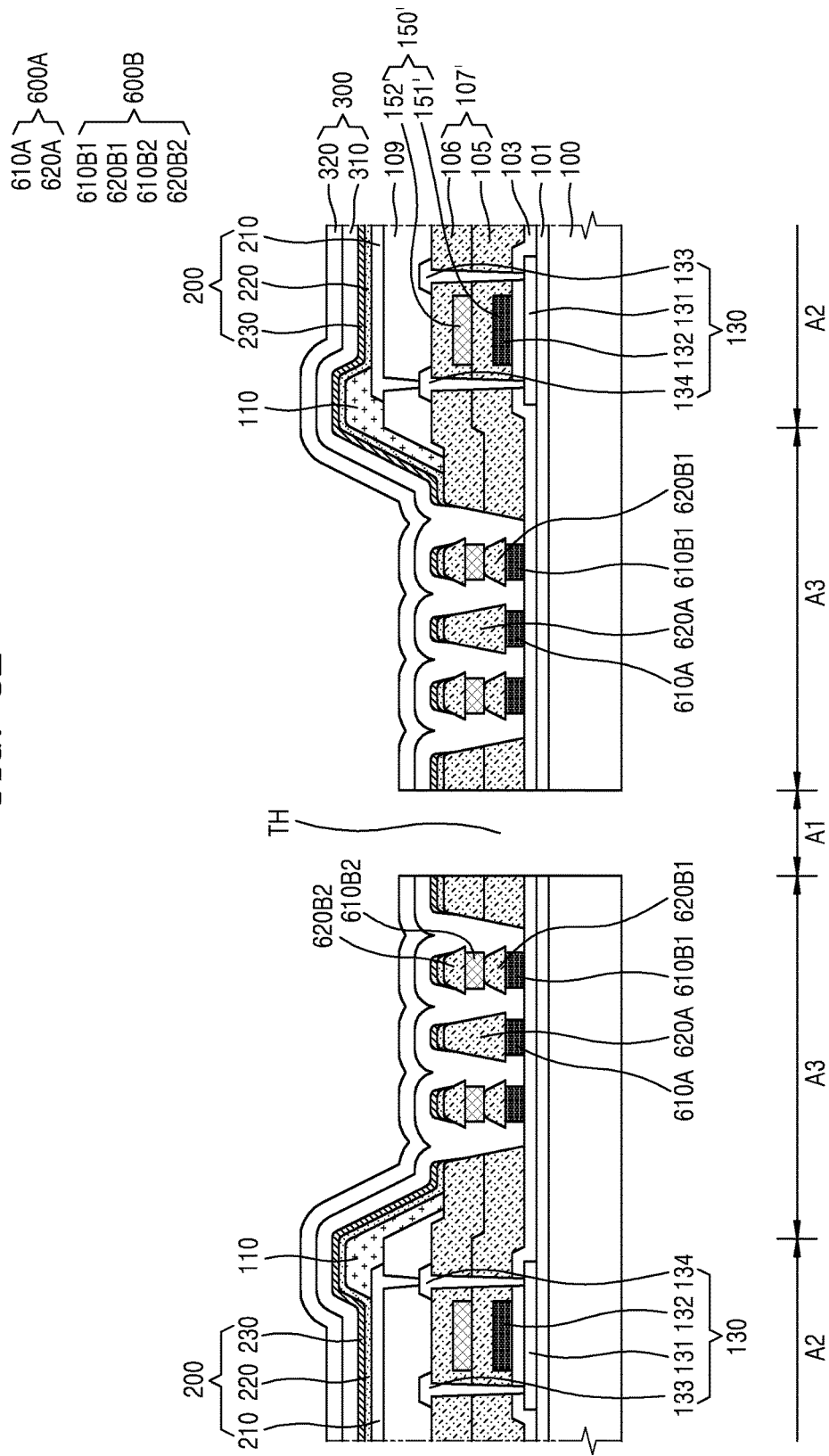

Referring to FIG. 8E, the protection layer 300 is formed on the substrate 100, and then the through-hole (e.g., the opening) TH penetrating through the first area A1 of the substrate 100 is formed.

The protection layer 300 includes at least one of the organic layer 320 including organic-inorganic composite particles and the inorganic layer 310, and materials thereof are as described above.

Figure 9:
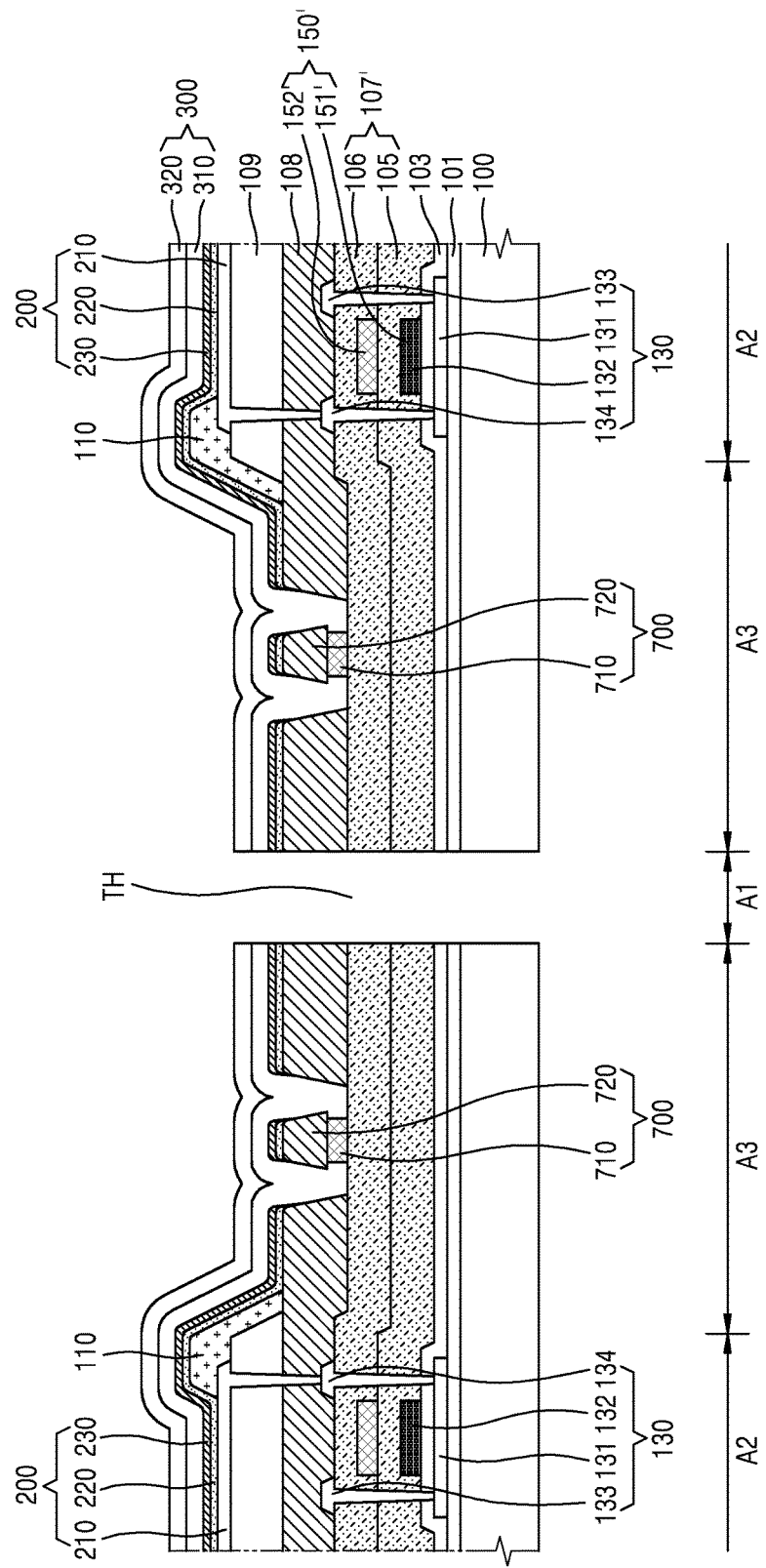
FIG. 9 is a cross-sectional view of an organic light-emitting display according to another embodiment of the present invention.

FIG. 9 is a cross-sectional view of an organic light-emitting display according to another embodiment of the present invention.

The organic light-emitting display of FIG. 9 is different from the organic light-emitting display of FIG. 5 in terms of the structure of a stepped portion. Differences therebetween will now be focused on and further described.

A stepped portion 700 includes a first layer 710 and a second layer 720 disposed over the first layer 710, and has an undercut structure in which an upper surface (or upper portion) of the first layer 710 is narrower than a lower surface (or lower portion) of the second layer 720.

During the formation of the intermediate layer 220 and the opposite electrode layer 230, the intermediate layer 220 and the opposite electrode layer 230 are disconnected by the stepped portion 700 having an under-cut step. The first layer 710 of the stepped portion 700 may be formed to have a greater thickness than at least one of the intermediate layer 220 and the opposite electrode layer 230, and thus the disconnection of the intermediate layer 220 and the opposite electrode layer 230 may be effectively induced.

The first layer 710 of the stepped portion 700 may include metal. For example, the first layer 710 may be disposed on the same layer on which the source and drain electrodes 133 and 134 of the TFT 130 are disposed, and may include the same or substantially the same material as that used to form the source and drain electrodes 133 and 134 of the TFT 130.

The second layer 720 of the stepped portion 700 may include the same or substantially the same material as that used to form a protective insulating layer 108 positioned on the interlayer insulating layer 107'. The protective insulating layer 108 may include an inorganic material including oxide or nitride.

FIGS. 10A-10E are cross-sectional views illustrating a method of manufacturing an organic light-emitting display, according to another embodiment of the present invention. FIGS. 10A-10E correspond to a method of manufacturing the organic light-emitting display described above with reference to FIG. 9.

Figure 10A:
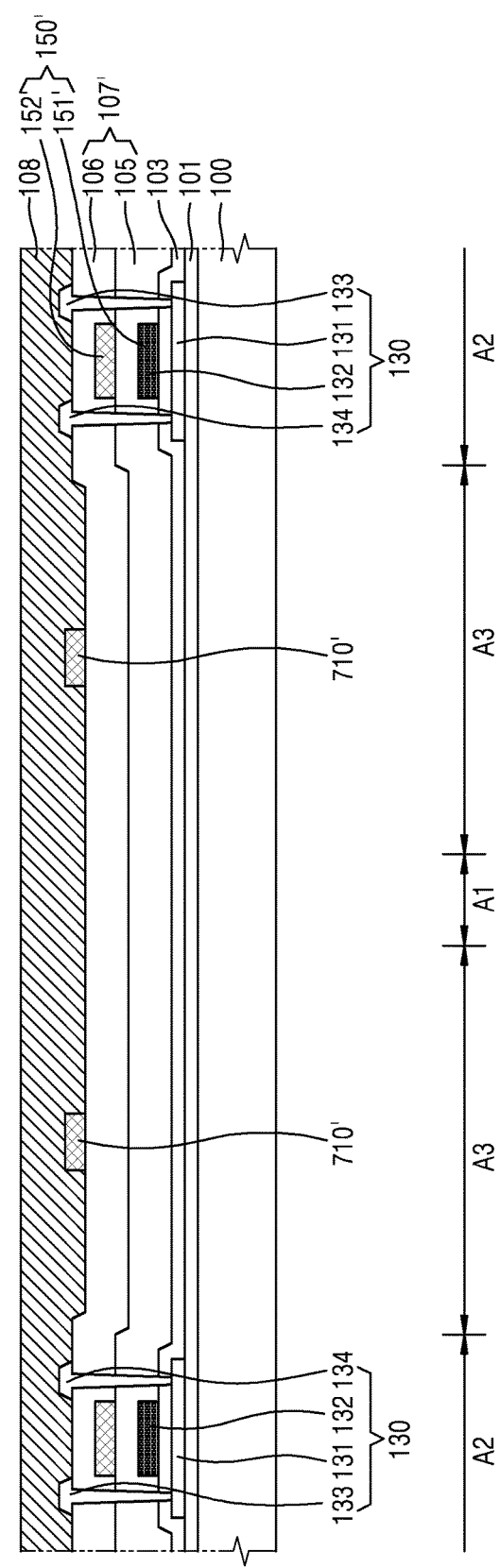
FIGS. 10A-10E are cross-sectional views illustrating a method of manufacturing an organic light-emitting display, according to another embodiment of the present invention.

Referring to FIG. 10A, the buffer layer 101 is formed on the substrate 100 including the first through third areas A1, A2, and A3, and the TFT 130 and the storage capacitor 150' are formed in the second area A2. A detailed method of forming the TFT 130 and the storage capacitor 150' is substantially as described above with reference to FIGS. 6A-6F and FIGS. 8A-8E.

A preliminary first layer 710' is formed together with the source and drain electrodes 133 and 134 of the TFT 130 during the same process. The preliminary first layer 710' is formed on the same layer on which the source and drain electrodes 133 and 134 are formed, and includes the same or substantially the same material as that used to form the source and drain electrodes 133 and 134.

The protective insulating layer 108 is formed on the source electrode 133, the drain electrode 134, and the preliminary first layer 710'.

Figure 10B:
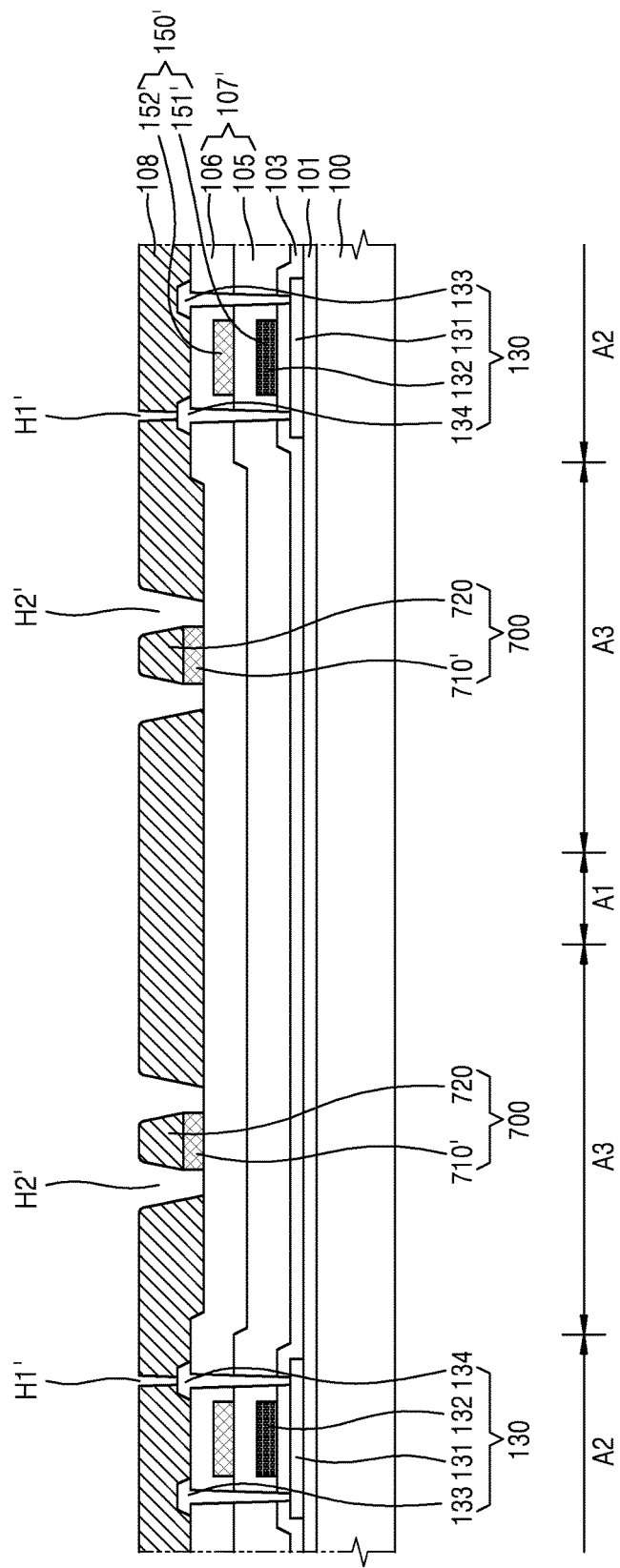

Referring to FIG. 10B, holes penetrating through the protective insulating layer 108 are formed via etching. For example, first holes H1' and second holes H2' penetrating through the protective insulating layer 108 are formed via wet or dry etching. The first holes H1' are located in the second area A2, and the second holes H2' are located in the third area A3.

One of the source and drain electrodes 133 and 134 in the second area A2 is exposed via the first holes H1'. An end of the preliminary first layer 710' in the third area A3 is exposed via the second holes H2', and an insulating layer remains on the preliminary first layer 710'. The remaining insulating layer forms the second layer 720 of the stepped portion 700, which will be described later.

Figure 10C:
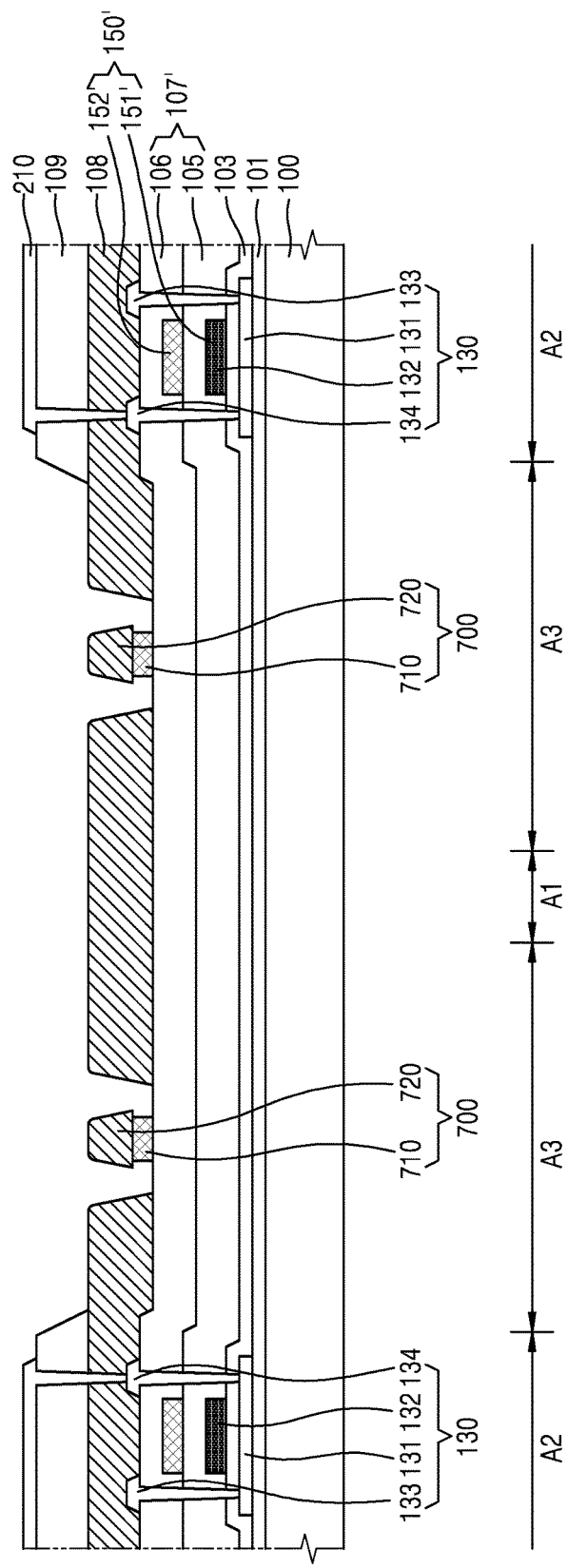

Referring to FIG. 10C, the planarization insulating layer 109 is formed in the second area A2 of the substrate 100, and a conductive layer is formed on the planarization insulating layer 109 and then patterned to form the pixel electrode layer 210.

During the formation of the pixel electrode layer 210, the stepped portion 700 is also formed. While the end of the preliminary first layer 710' exposed via the second holes H2' is being etched (under-cut etched) by an etchant used during the etching process for forming the pixel electrode layer 210, the first layer 710 is formed. The first layer 710 may be narrower than the second layer 720.

The first layer 710 and the second layer 720 having different widths form the stepped portion 700 via undercut etching. The upper surface (or upper portion) of the first layer 710 is narrower than the lower surface (or lower portion) of the second layer 720.

Figure 10D:
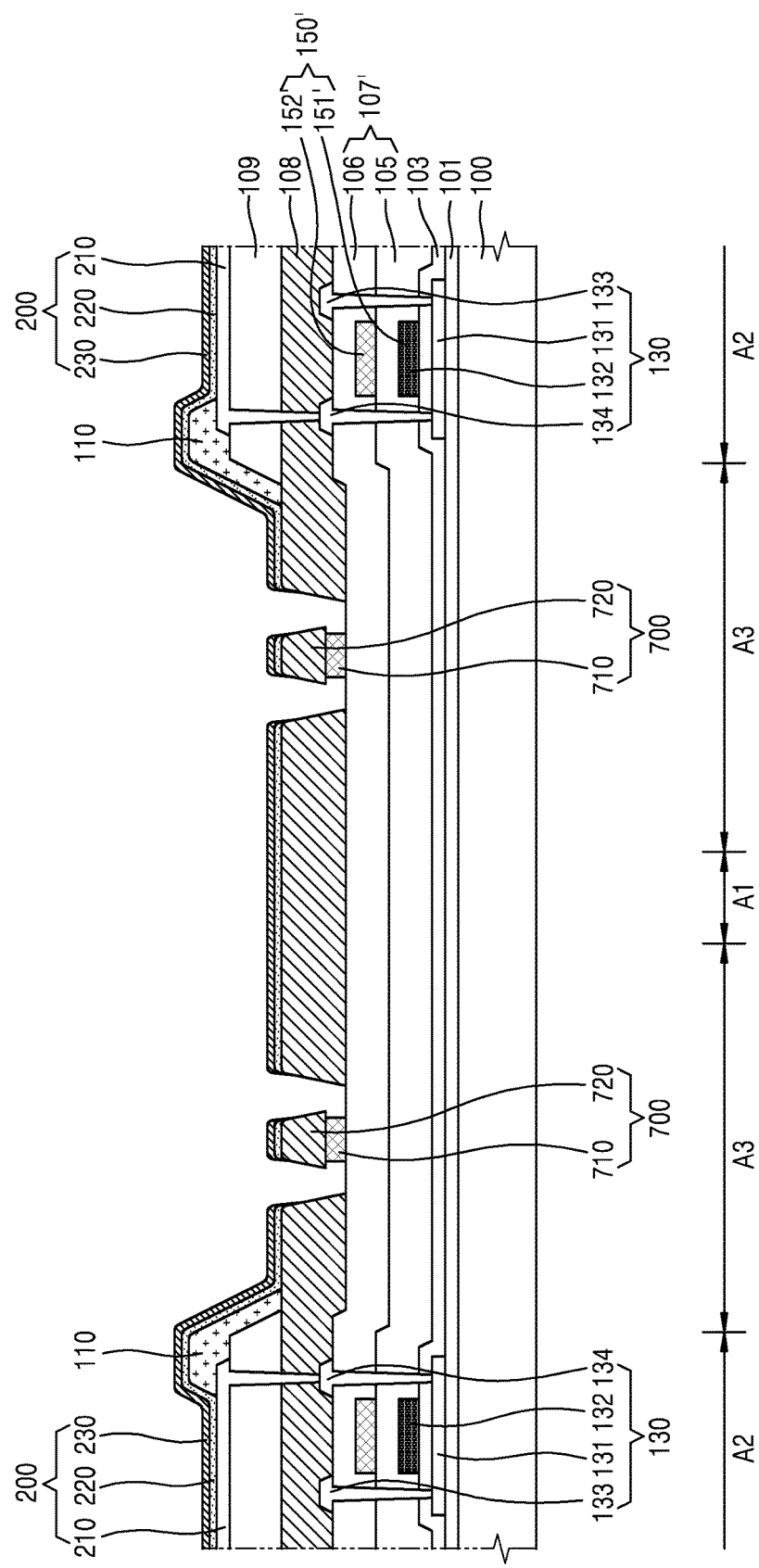

Referring to FIG. 10D, the pixel defining layer 110 exposing the pixel electrode layer 210 is formed on the substrate 100, and the intermediate layer 220 and the opposite electrode layer 230 are formed on the pixel defining layer 110. At least one of the intermediate layer 220 and the opposite electrode layer 230 covers an entire upper surface of the substrate 100, but is disconnected by the stepped portion 700.

Figure 10E:
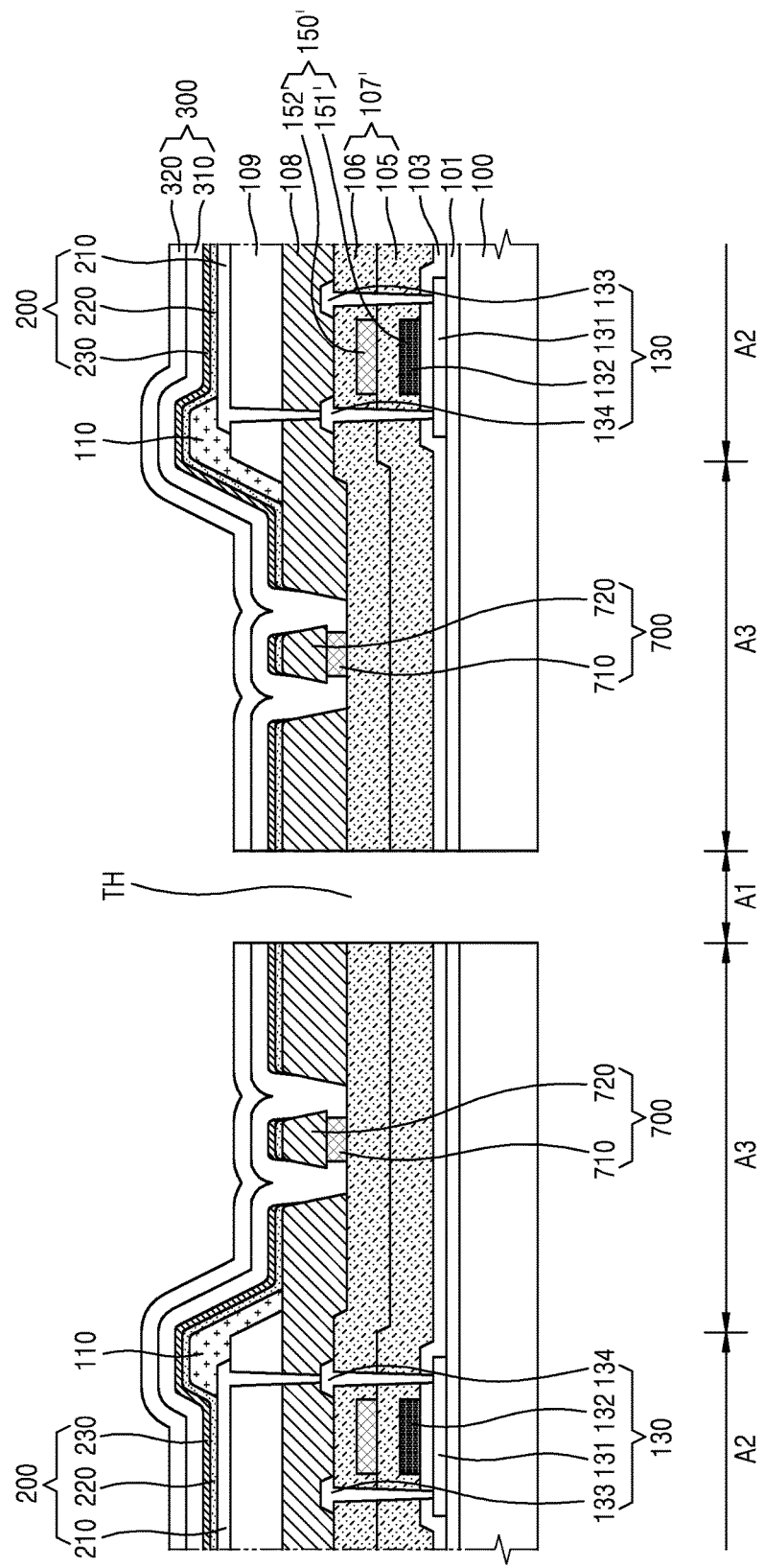

Referring to FIG. 10E, the protection layer 300 is formed on the substrate 100, and then the through-hole (e.g., the opening) TH penetrating through the first area Al of the substrate 100 is formed.

The protection layer 300 includes at least one of the organic layer 320 including organic-inorganic composite particles and the inorganic layer 310, and materials thereof are as described above.

Figure 11A:
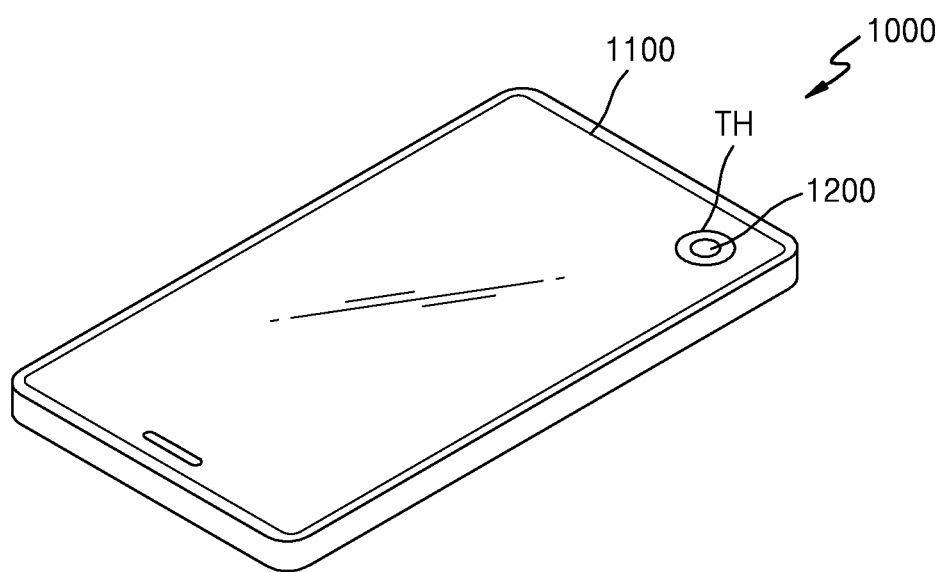
FIGS. 11A-11C illustrate electronic apparatuses including organic light-emitting displays according to embodiments of the present invention.
Figure 11B:
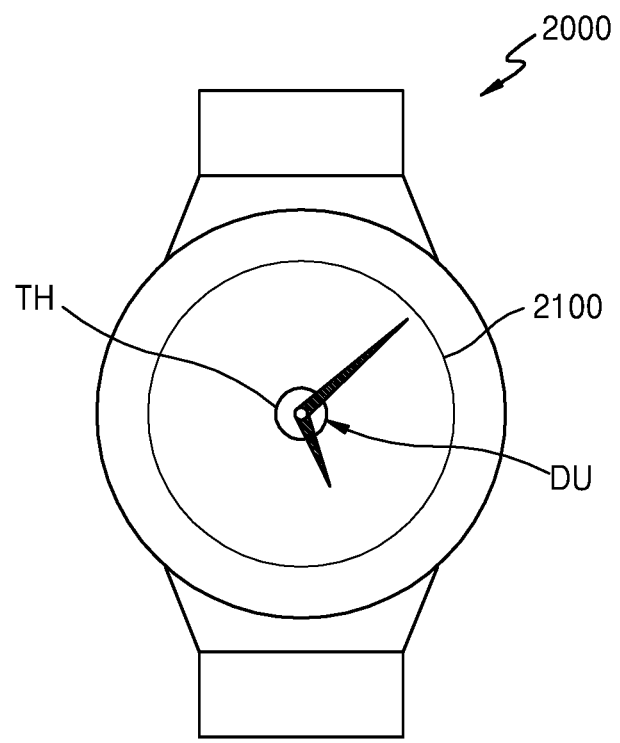
Figure 11C:
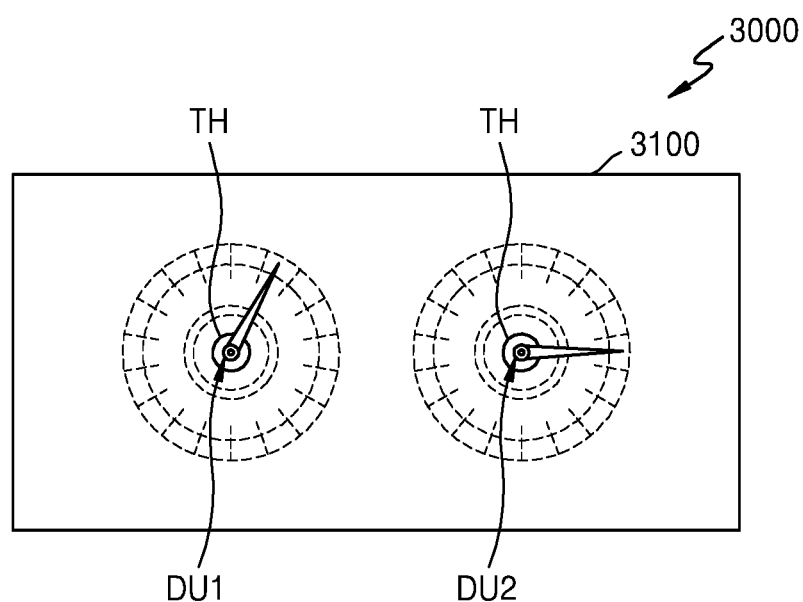

FIGS. 11A-11C illustrate electronic apparatuses including organic light-emitting displays according to embodiments of the present invention.

Referring to FIG. 11A, the organic light-emitting displays according to the above-described embodiments may be included in a mobile phone 1000. A pixel array of the organic light-emitting displays according to the above-described embodiments may form a display 1100 of the mobile phone 1000, and a component 1200 such as a camera may be positioned within the through-hole TH.

The position of the through-hole TH is not limited to the position illustrated in FIG. 11A. According to another embodiment, the through-hole TH may be disposed on the center of a bottom of the display 1100 of the mobile phone 1000. In this case, a button may be positioned within the through-hole TH.

Referring to FIG. 11B, the organic light-emitting displays according to the above-described embodiments may be included in a smart watch 2000. A pixel array of the organic light-emitting displays according to the above-described embodiments may form a display 2100 of the smart watch 2000, and a driving component DU including a minute hand and an hour hand may be disposed within the through-hole TH.

Referring to FIG. 11C, the organic light-emitting displays according to the above-described embodiments may be included in a dashboard 3000 for vehicles. A pixel array of the organic light-emitting displays according to the above-described embodiments may form a display 3100 of the dashboard 3000 for vehicles. A plurality of through-holes (e.g., a plurality of openings) TH may be included.

According to an embodiment, the through-holes TH may respectively include a first driving component DU1 including a needle that displays an engine RPM, and a second driving component DU2 including a needle that displays a speed.

Embodiments of the present invention provide an organic light-emitting display and a method of manufacturing the same, by which a stepped portion having an undercut structure is disposed to block a path via which moisture is infiltrated in a lateral direction.

It should be understood that embodiments described herein should be considered in a descriptive sense only and not for purposes of limitation. Descriptions of features or aspects within each embodiment should typically be considered as available for other similar features or aspects in other embodiments.

When a certain embodiment may be implemented differently, a specific process order may be performed differently from the described order. For example, two consecutively described processes may be performed substantially at the same time or performed in an order opposite to the described order.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The organic light-emitting diode (OLED) display and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the OLED display may be formed on one integrated circuit (IC) chip or on separate IC chips. Further, the various components of the OLED display may be implemented on a flexible printed circuit film, a tape carrier package (TCP), a printed circuit board (PCB), or formed on a same substrate. Further, the various components of the OLED display may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. An organic light-emitting display comprising:
   a substrate comprising a first area, a second area surrounding the first area, and a third area between the first area and the second area;
   an insulating layer on the substrate, the substrate and the insulating layer having an opening therethrough penetrating, the opening being in the first area;
   a pixel array on the insulating layer, the pixel array comprising a plurality of pixels that are in the second area and surround the opening, a first pixel adjacent to the third area from among the plurality of pixels comprises a pixel electrode layer, an intermediate layer on the pixel electrode layer, and an opposite electrode layer on the intermediate layer; and
   a stepped portion in the third area to be adjacent to the opening, the stepped portion having an under-cut step and being offset from the second area,
   wherein the intermediate layer comprises an organic emission layer, and
   wherein at least one of the intermediate layer or the opposite electrode layer extends toward the opening and is disconnected by the stepped portion.

2. An organic light-emitting display comprising:
   a substrate;
   an insulating layer on the substrate, the substrate and the insulating layer having an opening therethrough penetrating;
   a pixel array on the insulating layer, the pixel array comprising a plurality of pixels that surround the opening, a first pixel adjacent to the opening from among the plurality of pixels comprises a pixel electrode layer, an intermediate layer on the pixel electrode layer, and an opposite electrode layer on the intermediate layer; and
   a stepped portion on the substrate and adjacent to the opening, the stepped portion having an under-cut step,
   wherein the intermediate layer comprises an organic emission layer,
   wherein at least one of the intermediate layer or the opposite electrode layer extends toward the opening and is disconnected by the stepped portion,
   wherein the insulating layer comprises a recess that is concave in a thickness direction of the insulating layer, and
   wherein the stepped portion is within the recess.

3. The organic light-emitting display of claim 2, wherein the stepped portion comprises:
   a first layer within the recess; and
   a second layer over the first layer,
   wherein a width of an upper portion of the first layer is less than a width of a lower portion of the second layer.

4. The organic light-emitting display of claim 3, wherein the first layer and the second layer comprise different materials.

5. The organic light-emitting display of claim 3, wherein the first layer comprises metal.

6. The organic light-emitting display of claim 3,
wherein the first pixel further comprises a pixel circuit electrically connected to the pixel electrode layer, and
wherein the pixel circuit comprises a thin film transistor (TFT) comprising a gate electrode, an active layer, a source electrode, and a drain electrode, and the pixel circuit further comprises a storage capacitor comprising a lower electrode and an upper electrode.

7. The organic light-emitting display of claim 6, wherein the first layer comprises a same material as that of one of the gate electrode, the source electrode, the drain electrode, the lower electrode, and the upper electrode.

8. The organic light-emitting display of claim 3, wherein the second layer comprises a same material as that of the insulating layer.

9. The organic light-emitting display of claim 3, wherein a thickness of the first layer is greater than a thickness of at least one of the intermediate layer or the opposite electrode layer.

10. The organic light-emitting display of claim 9, further comprising a protection layer that covers the at least one of the intermediate layer or the opposite electrode layer.

11. The organic light-emitting display of claim 10, wherein the protection layer comprises at least one of an organic layer and an inorganic layer, the organic layer comprising organic-inorganic composite particles.

* * * * *